US010684671B2

(12) United States Patent
Sridhar et al.

(10) Patent No.: US 10,684,671 B2
(45) Date of Patent: Jun. 16, 2020

(54) ADAPTIVELY CONTROLLING DRIVE STRENGTH OF MULTIPLEXED POWER FROM SUPPLY POWER RAILS IN A POWER MULTIPLEXING SYSTEM TO A POWERED CIRCUIT

(71) Applicant: QUALCOMM Incorporated, San Diego, CA (US)

(72) Inventors: Shraddha Sridhar, Raleigh, NC (US); Yeshwant Nagaraj Kolla, Wake Forest, NC (US); Neel Shashank Natekar, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 524 days.

(21) Appl. No.: 15/593,809

(22) Filed: May 12, 2017

(65) Prior Publication Data

US 2017/0346299 A1 Nov. 30, 2017

Related U.S. Application Data

(60) Provisional application No. 62/342,560, filed on May 27, 2016, provisional application No. 62/459,187, filed on Feb. 15, 2017.

(51) Int. Cl.
*G06F 1/3296* (2019.01)
*G11C 5/14* (2006.01)
(Continued)

(52) U.S. Cl.
CPC ............ *G06F 1/3296* (2013.01); *G11C 5/147* (2013.01); *G01R 19/0084* (2013.01); *H02J 1/082* (2020.01);
(Continued)

(58) Field of Classification Search
CPC .......... G06F 1/3296; G06F 1/32–3296; G11C 5/14–148
See application file for complete search history.

(56) References Cited

U.S. PATENT DOCUMENTS 6,281,724 B1  8/2001  Ellis
7,498,836 B1  3/2009  Tuan
(Continued)

FOREIGN PATENT DOCUMENTS

CN  101165635 A  4/2008
CN  103377692 A  10/2013
(Continued)

OTHER PUBLICATIONS

Cheng, Wayne H. et al., "Dynamic Voltage and Frequency Scaling Circuits with Two Supply Voltages," IEEE International Symposium on Circuits and Systems, ISCAS 2008, May 18, 2008, pp. 1236-1239.
(Continued)

*Primary Examiner* — Rexford N Barnie
*Assistant Examiner* — David A Shiao
(74) *Attorney, Agent, or Firm* — W&T/Qualcomm

(57) ABSTRACT

Adaptively controlling drive strength of multiplexed power from supply power rails in a power multiplexing system to a powered circuit is disclosed. A power multiplexing circuit in the power multiplexing system includes a plurality of supply selection circuits (e.g., head switches) each coupled between a respective supply power rail and an output power rail coupled to the powered circuit. The power multiplexing circuit is configured to activate a selected supply selection circuit to switch coupling of an associated supply power rail to the output power rail to power the powered circuit. In one example, the supply selection circuits each include a plurality of power switch selection circuits coupled to an
(Continued)

associated supply power rail. The power switch selection circuits are configured to be activated and deactivated by a control circuit to adjust drive strength of a multiplexed supply power rail based on operational conditions, which can account for performance variations.

36 Claims, 15 Drawing Sheets

(51) Int. Cl.
  *H03K 19/003* (2006.01)
  *H03K 19/00* (2006.01)
  *H02J 1/08* (2006.01)
  *G01R 19/00* (2006.01)

(52) U.S. Cl.
  CPC ... *H03K 19/0016* (2013.01); *H03K 19/00384* (2013.01)

(56) References Cited

U.S. PATENT DOCUMENTS

| | | | |
|---|---|---|---|
| 7,589,584 B1 | 9/2009 | Bui | |
| 7,737,720 B2 | 6/2010 | Idgunji et al. | |
| 7,786,870 B2 | 8/2010 | Zettler | |
| 8,138,795 B2 | 3/2012 | Hsieh et al. | |
| 8,139,436 B2 | 3/2012 | Chen et al. | |
| 8,183,713 B2 | 5/2012 | Rao et al. | |
| 8,595,671 B2 | 11/2013 | He | |
| 8,605,534 B1 | 12/2013 | Lee et al. | |
| 8,635,572 B1 | 1/2014 | Jin et al. | |
| 9,001,572 B2 | 4/2015 | Choi et al. | |
| 9,059,696 B1 | 6/2015 | Rahman | |
| 9,225,175 B2 | 12/2015 | Kim | |
| 9,337,660 B1 | 5/2016 | Bourstein | |
| 9,734,904 B1* | 8/2017 | Cho | G11C 13/0038 |
| 9,785,181 B2 | 10/2017 | Ichino | |
| 9,825,488 B2 | 11/2017 | Shinomoto et al. | |
| 2001/0052758 A1 | 12/2001 | Odaohhara | |
| 2002/0158683 A1 | 10/2002 | Berthold | |
| 2007/0210750 A1 | 9/2007 | Cha | |
| 2008/0043560 A1 | 2/2008 | Ko et al. | |
| 2008/0284407 A1 | 11/2008 | Miermont et al. | |
| 2010/0254209 A1 | 10/2010 | Lee et al. | |
| 2011/0095803 A1* | 4/2011 | Meijer | G06F 1/3203 327/291 |
| 2012/0117391 A1 | 5/2012 | Jacquet et al. | |
| 2014/0040647 A1* | 2/2014 | Bridges | G06F 1/324 713/322 |
| 2014/0070878 A1* | 3/2014 | Kawasaki | G06F 1/3203 327/543 |
| 2014/0089690 A1* | 3/2014 | Fukuda | G06F 1/26 713/300 |
| 2014/0097702 A1 | 4/2014 | Upputuri et al. | |
| 2014/0167813 A1 | 6/2014 | Raychowdhury et al. | |
| 2014/0223205 A1* | 8/2014 | Muthukaruppan | G06F 1/32 713/320 |
| 2015/0036446 A1* | 2/2015 | Kenkare | H02J 1/00 365/226 |
| 2015/0067290 A1 | 3/2015 | Chaba et al. | |
| 2015/0082065 A1 | 3/2015 | Bose et al. | |
| 2015/0177823 A1* | 6/2015 | Maiyuran | G06F 1/324 713/320 |
| 2016/0064928 A1* | 3/2016 | Jantti | G11C 5/147 307/33 |
| 2016/0109932 A1* | 4/2016 | Jeon | G11C 5/14 713/323 |
| 2016/0306412 A1 | 10/2016 | Kolla et al. | |
| 2016/0308372 A1 | 10/2016 | Kolla et al. | |
| 2017/0083033 A1* | 3/2017 | Park | G05F 1/575 |
| 2017/0134010 A1* | 5/2017 | Tsukamoto | H02J 4/00 |
| 2017/0308153 A1* | 10/2017 | Chou | G06F 1/3287 |

FOREIGN PATENT DOCUMENTS

| | | |
|---|---|---|
| CN | 103901959 A | 7/2014 |
| CN | 104347620 A | 2/2015 |
| CN | 204190484 U | 3/2015 |
| JP | H0583884 A | 4/1993 |
| JP | 2014110725 A | 6/2014 |
| KR | 20010005090 A | 1/2001 |
| WO | 09086149 A1 | 7/2009 |

OTHER PUBLICATIONS

International Search Report and Written Opinion for PCT/US2017/032632, dated Jul. 25, 2017, 19 pages.
Second Written Opinion for PCT/US2017/032632, dated May 3, 2018, 9 pages.
International Preliminary Report on Patentability for PCT/US2017/032632, dated Sep. 7, 2018, 31 pages.
Bhardwaj, Nitin, "Decoupling Capacitance," Electrical & Computer Engineering, University of Rochester, NY, Date Unknown, 4 pages.

* cited by examiner

| inputs-> | ADAPTIVE MODE SELECTION SIGNAL (714) | APM ENABLE SIGNAL (718) | RETENTION INPUT SIGNAL (716) | RETENTION OUTPUT SIGNAL (620) | MEMORY DRIVE STRENGTH INDICATOR (518M) |
|---|---|---|---|---|---|
| State | | | | | |
| ASR Bypass | 0 | X | X | RETENTION INPUT SIGNAL (716) | BYPASS DRIVE STRENGTH INDICATOR (706) |
| Collapse | 1 | 0 | 0 | 0 | MEMORY ADAPTIVE DRIVE STRENGTH INDICATOR (710) |
| ASR Enable | 1 | 0 | 1 | 0 | MEMORY ADAPTIVE DRIVE STRENGTH INDICATOR (710) |
| Functional | 1 | 1 | 0 | 0 | MEMORY ADAPTIVE DRIVE STRENGTH INDICATOR (710) |
| Switching Between Supply Power Rails (504M, 504L) | 1 | 1 | 1 | 1 | MEMORY ADAPTIVE DRIVE STRENGTH INDICATOR (710) |

*FIG. 8*

ADAPTIVELY CONTROLLING DRIVE STRENGTH OF MULTIPLEXED POWER FROM SUPPLY POWER RAILS IN A POWER MULTIPLEXING SYSTEM TO A POWERED CIRCUIT

PRIORITY APPLICATIONS

This application claims priority under 35 U.S.C. § 119(e) to U.S. Provisional Patent Application Ser. No. 62/342,560 filed on May 27, 2016 and entitled "ADAPTIVE DRIVE STRENGTH REGULATION OF SUPPLY SELECTION CIRCUITS IN A POWER MULTIPLEXING SYSTEM," which is incorporated herein by reference in its entirety.

This application also claims priority under 35 U.S.C. § 119(e) to U.S. Provisional Patent Application Ser. No. 62/459,187 filed on Feb. 15, 2017 and entitled "ADAPTIVELY CONTROLLING DRIVE STRENGTH OF MULTIPLEXED POWER FROM SUPPLY POWER RAILS IN A POWER MULTIPLEXING SYSTEM TO A POWERED CIRCUIT," which is also incorporated herein by reference in its entirety.

BACKGROUND

I. Field of the Disclosure

The technology of the disclosure relates generally to power multiplexing systems configured to selectively supply power from multiple power rails to operational circuits.

II. Background

Circuits are increasingly being designed with power conservation in mind. This is particularly the case for portable electronic devices that are battery-powered. Common examples include mobile phones and laptop computers, among others. Increased power consumption undesirably results in faster battery drainage and shorter battery life. One method of conserving power is to lower an operating frequency of a circuit according to the active power equation $P=CV^2f$. However, reducing the operating frequency results in lower circuit performance (i.e., speed). Another method of conserving power is to lower the operating voltage, since generally, active power reduces quadratically for a given reduction in operating voltage. However, lowering the operating voltage in a circuit lowers speed performance, which may also be undesirable. Further, certain cells or components of a circuit may have a minimum operating voltage below which they will not operate to read and write data, as well as retain data.

To address the tradeoff between performance and power consumption, multiple operating voltage domains ("voltage domains") are increasingly being provided in circuits. Circuit paths are provided that pass through multiple voltage domains to provide different operating voltages to different components of a circuit. Providing multiple voltage domains allows a lower voltage domain to provide power to components that do not require minimum voltage levels to conserve power. Components that either have a minimum operating voltage for memory operation functionality or provide critical paths where performance cannot be sacrificed may be powered by the higher voltage domain. Providing multiple voltage domains also allows the lower voltage domain to be scaled-down to conserve power during a power conservation mode, or scaled-up to provide for increased performance (i.e., hyper-performance), without affecting the operation of the components in the higher voltage domain.

In this regard, a power multiplexing system can be employed to selectively couple a power rail among multiple power rails each having different voltage domains (i.e., voltage levels) to supply power to a circuit. FIG. 1 is a block diagram of such an exemplary power multiplexing system 100. In the power multiplexing system 100 in FIG. 1, a first supply power rail 102(1) and a second supply power rail 102(2) are provided. The first supply power rail 102(1) is configured to provide a first voltage source 104(1) at a first voltage $V_{DD(1)}$. The second supply power rail 102(2) is configured to provide a second voltage source 104(2) at a second voltage $V_{DD(2)}$. The first and second voltage sources 104(1), 104(2) may be provided by the same or different power supplies (not shown). For example, the first voltage $V_{DD(1)}$ may be 1 Volt (V) and the second voltage $V_{DD(2)}$ may be 0.6 V. As an example, the power multiplexing system 100 may be configured to selectively couple the first supply power rail 102(1) or the second supply power rail 102(2) to an output power rail 104 coupled to a powered circuit 106 based on an operational mode of the powered circuit 106. For example, if the powered circuit 106 is a memory circuit, such as a memory array in a processor-based system, the power multiplexing system 100 may be configured to couple the first supply power rail 102(1) to the output power rail 104 during active memory operations, and couple the second supply power rail 102(2) to the output power rail 104 during an idle mode. For example, the second voltage $V_{DD(2)}$ may be sufficient for memory retention in the powered circuit 106.

With continuing reference to FIG. 1, the power multiplexing system 100 includes a first head switch circuit 108(1) in the form of a P-type metal oxide semiconductor (MOS) (PMOS) transistor 110(1). The PMOS transistor 110(1) is coupled between the first supply power rail 102(1) and the output power rail 104. The PMOS transistor 110(1) is configured to be activated and deactivated in response to a state of a first power rail enable signal 112(1) to couple and decouple, respectively, the first supply power rail 102(1) to the output power rail 104. The power multiplexing system 100 also includes a second head switch circuit 108(2), also in the form of a PMOS transistor 110(2) that is coupled between the second supply power rail 102(2) and the output power rail 104. The second head switch circuit 108(2) is configured to selectively couple and decouple the second supply power rail 102(2) to and from the output power rail 104 in response to a second power rail enable signal 112(2).

The first and second PMOS transistors 110(1), 110(2) in the first and second head switch circuits 108(1), 108(2) are sized to provide the desired drive strength to supply power from the first and second power rails 102(1), 102(2) to the output power rail 104. However, process voltage temperature (PVT) variations can vary the drive strength of the first and second PMOS transistors 110(1), 110(2) from their expected drive strength. The first and second PMOS transistors 110(1), 110(2) can be oversized and/or additional transistors can be provided in the respective first and second head switch circuits 108(1), 108(2) to increase drive strength to provide a drive strength margin in the voltage $V_{DD(1)}$, $V_{DD(N)}$ provided by the first and second voltage sources 104(1), 104(2) on the output power rail 104 when the respective first and second power rails 102(1), 102(2) are coupled to the output power rail 104. However, increasing drive strength through providing oversized and/or additional transistors in the power multiplexing system 100 increases leakage power.

SUMMARY OF THE DISCLOSURE

Aspects disclosed in the detailed description include adaptively controlling drive strength of multiplexed power from supply power rails in a power multiplexing system to a powered circuit. In exemplary aspects disclosed herein, a power multiplexing circuit is provided in the power multiplexing system. The power multiplexing circuit includes a plurality of supply selection circuits each coupled between a respective supply power rail among a plurality of supply power rails and an output power rail, which is coupled to a powered circuit. The power multiplexing circuit is configured to activate a selected supply selection circuit among the plurality of supply selection circuits to switch the coupling of an associated supply power rail to the output power rail to power the powered circuit. To provide for the ability to control the drive strength of an activated supply selection circuit in the power multiplexing circuit, exemplary aspects disclosed herein also provide for each supply selection circuit in the power multiplexing circuit to be configured to selectively drive a voltage from an associated supply power rail to the output power rail at a controlled drive strength based on a drive strength indicator. In this manner, as an example, the drive strength of the activated supply selection circuit can be adaptively controlled and adjusted to compensate for process voltage temperature (PVT) variations to reduce drive strength margin, and thus leakage power as a result.

As one example, a power multiplexing system can be provided that is configured to adaptively control the drive strength of multiplexed power from a logic supply power rail and a memory supply power rail in multiple voltage domains to a memory array as a powered circuit. Power from the memory supply power rail is multiplexed to the memory array for data retention when the voltage of the logic supply power rail may not be sufficient to power the memory array for data retention. The power multiplexing circuit includes a logic supply selection circuit configured to selectively couple the logic supply power rail to an output power rail, which is coupled to the memory array. The power multiplexing circuit also includes a memory supply selection circuit configured to selectively couple the memory supply power rail to the output power rail. The logic and memory supply selection circuits each include a respective plurality of logic and memory power switch circuits (e.g., head switches) coupled between the respective logic and memory supply power rails and the output power rail. Each of the logic and memory power switch circuits has an associated drive strength. The logic and memory power switch circuits are each configured to be individually activated to couple the logic or memory supply power rails to the output power rail, to contribute to driving the voltage of the activated logic or memory supply power rail to the output power rail. A control circuit is configured to control the drive strength of the activated logic or memory supply selection circuit. The logic supply selection circuit can be configured to couple the output power rail to the logic supply power rail for supplying power to the memory array when the logic supply power rail can satisfy a minimum operating voltage of the memory domain. In this manner, as a non-limiting example, additional intrinsic decoupling capacitance of the memory array is coupled to the logic supply power rail during higher power modes of the logic circuitry when the logic supply power rail can satisfy the minimum operating voltage of the memory array. Logic circuits in a logic domain can still be separately powered from the memory array if the power rail selection circuit couples a memory supply power rail to the output power rail. However, when the logic supply power rail cannot satisfy the minimum operating voltage of the memory array, the memory supply selection circuit can couple the memory supply rail to the output power rail to power the memory array from the memory power supply.

In this regard, in one exemplary aspect, a power multiplexing system is provided. The power multiplexing system comprises a power multiplexing circuit. The power multiplexing circuit comprises a first supply selection circuit coupled between a first supply power rail having a first voltage and an output power rail coupled to at least one powered circuit. The first supply selection circuit is configured to selectively drive the first voltage at the first supply power rail to the output power rail at a first drive strength based on a first drive strength indicator in response to a first supply power rail selection indicator indicating a first supply power rail selection enable state. The power multiplexing circuit also comprises a second supply selection circuit coupled between a second supply power rail having a second voltage and the output power rail. The second supply selection circuit is configured to selectively drive the second voltage at the second supply power rail to the output power rail at a second drive strength based on a second drive strength indicator in response to a second supply power rail selection indicator indicating a second supply power rail selection enable state. The power multiplexing system also comprises at least one control circuit. The at least one control circuit is configured to monitor an output voltage of the output power rail. In response to the first supply power rail selection indicator indicating the first supply power rail selection enable state, the at least one control circuit is configured to compare a voltage level of the output voltage at the output power rail to a first reference voltage level associated with the first supply selection circuit, and selectively generate the first drive strength indicator based on the comparison of the voltage level of the output voltage at the output power rail to the first reference voltage level. In response to the second supply power rail selection indicator indicating the second supply power rail selection enable state, the at least one control circuit is configured to compare the voltage level of the output voltage at the output power rail to a second reference voltage level associated with the second supply selection circuit, and selectively generate the second drive strength indicator based on the comparison of the voltage level of the output voltage at the output power rail to the second reference voltage level.

In another exemplary aspect, a power multiplexing system is provided. The power multiplexing system comprises a first supply means for selectively driving a first voltage at a first supply power rail to an output power rail at a first drive strength based on a first drive strength indicator in response to a first supply power rail selection indicator indicating a first supply power rail selection enable state. The power multiplexing system also comprises a second supply means for selectively driving a second voltage at a second supply power rail to the output power rail at a second drive strength based on a second drive strength indicator in response to a second supply power rail selection indicator indicating a second supply power rail selection enable state. The power multiplexing system also comprises a means for monitoring an output voltage of the output power rail. The power multiplexing system also comprises a means for comparing a voltage level of the output voltage at the output power rail to a first reference voltage level associated with a first supply selection circuit, in response to the first supply power rail selection indicator indicating the first supply power rail selection enable state. The power multiplexing system also comprises a means for selectively generating the first drive strength indicator based on the means for comparing the voltage level of the output voltage at the output power rail to the first reference voltage level, in response to the first supply power rail selection indicator indicating the first supply power rail selection enable state. The power multiplexing system also comprises a means for comparing the voltage level of the output voltage at the output power rail to a second reference voltage level associated with a second supply selection circuit in response to the second supply power rail selection indicator indicating the second supply power rail selection enable state. The power multiplexing system also comprises a means for selectively generating the second drive strength indicator based on the means for comparing the voltage level of the output voltage at the output power rail to the second reference voltage level in response to the second supply power rail selection indicator indicating the second supply power rail selection enable state.

In another exemplary aspect, a method of adaptively controlling drive strength of multiplexed power from supply power rails in a power multiplexing circuit to a powered circuit is provided. The method comprises monitoring an output voltage of an output power rail. In response to a first supply power rail selection indicator indicating a first supply power rail selection enable state, the method also comprises comparing a voltage level of the output voltage at the output power rail to a first reference voltage level associated with a first supply selection circuit, selectively generating a first drive strength indicator based on the comparison of the voltage level of the output voltage at the output power rail to the first reference voltage level, and selectively driving a first voltage at a first supply power rail to the output power rail at a first drive strength based on the first drive strength indicator. In response to a second supply power rail selection indicator indicating a second supply power rail selection enable state, the method comprises comparing the voltage level of the output voltage at the output power rail to a second reference voltage level associated with a second supply selection circuit, selectively generating a second drive strength indicator based on the comparison of the voltage level of the output voltage at the output power rail to the second reference voltage level, and selectively driving a second voltage at a second supply power rail to the output power rail at a second drive strength based on the second drive strength indicator.

BRIEF DESCRIPTION OF THE FIGURES

FIG. 8 is a logic table illustrating an exemplary operation of a control circuit in FIG. 7 to control of the diode drop control circuit in the power multiplexing circuit in FIG. 6, and adaptively control the drive strength of an activated selected supply selection circuit coupled to the output power rail based on an output voltage at the output power rail to account for performance variations;

DETAILED DESCRIPTION

Figure 1:
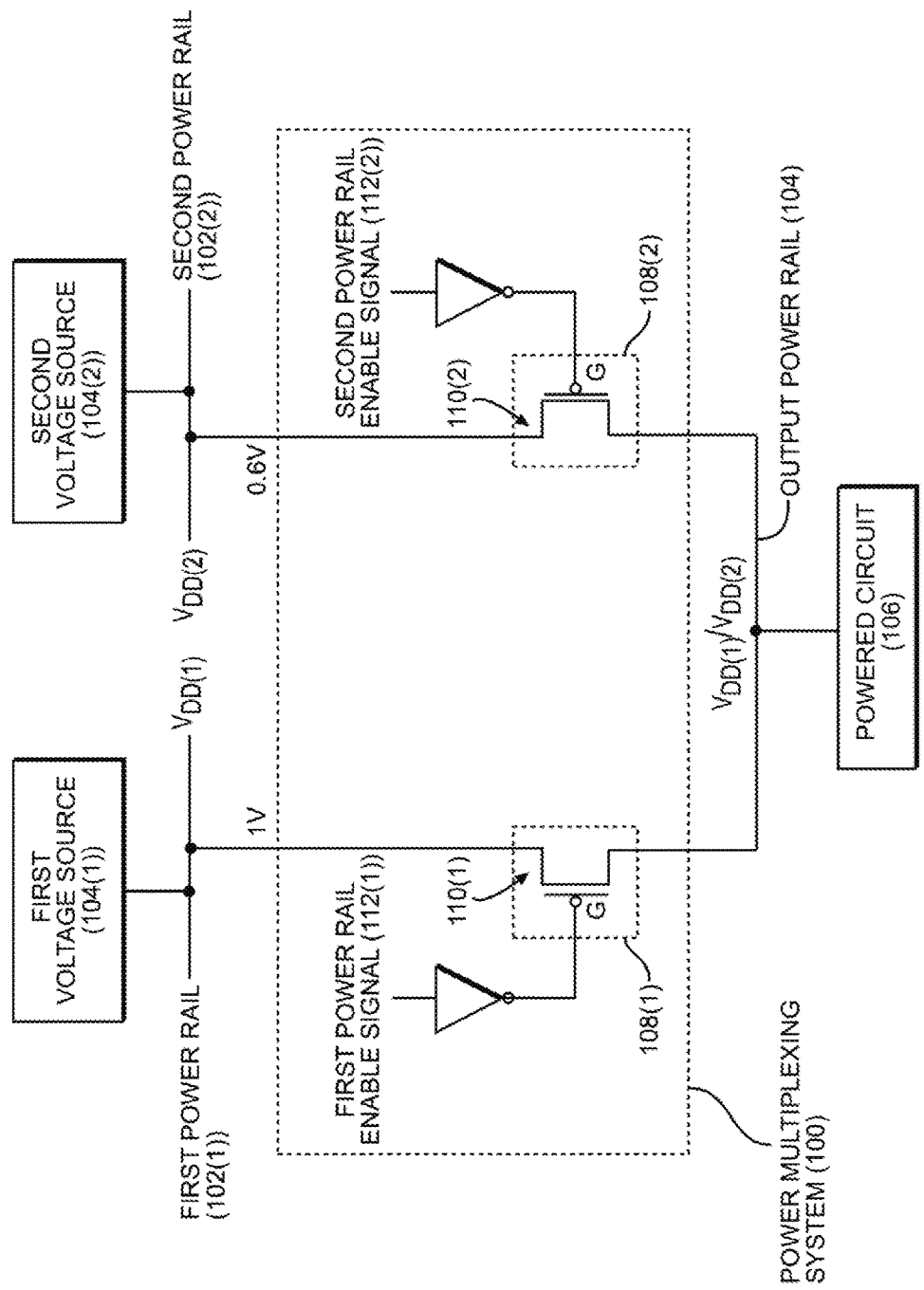
FIG. 1 is a block diagram of an exemplary power multiplexing system that is configured to selectively couple one supply power rail among a plurality of supply power rails to a powered circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 2:
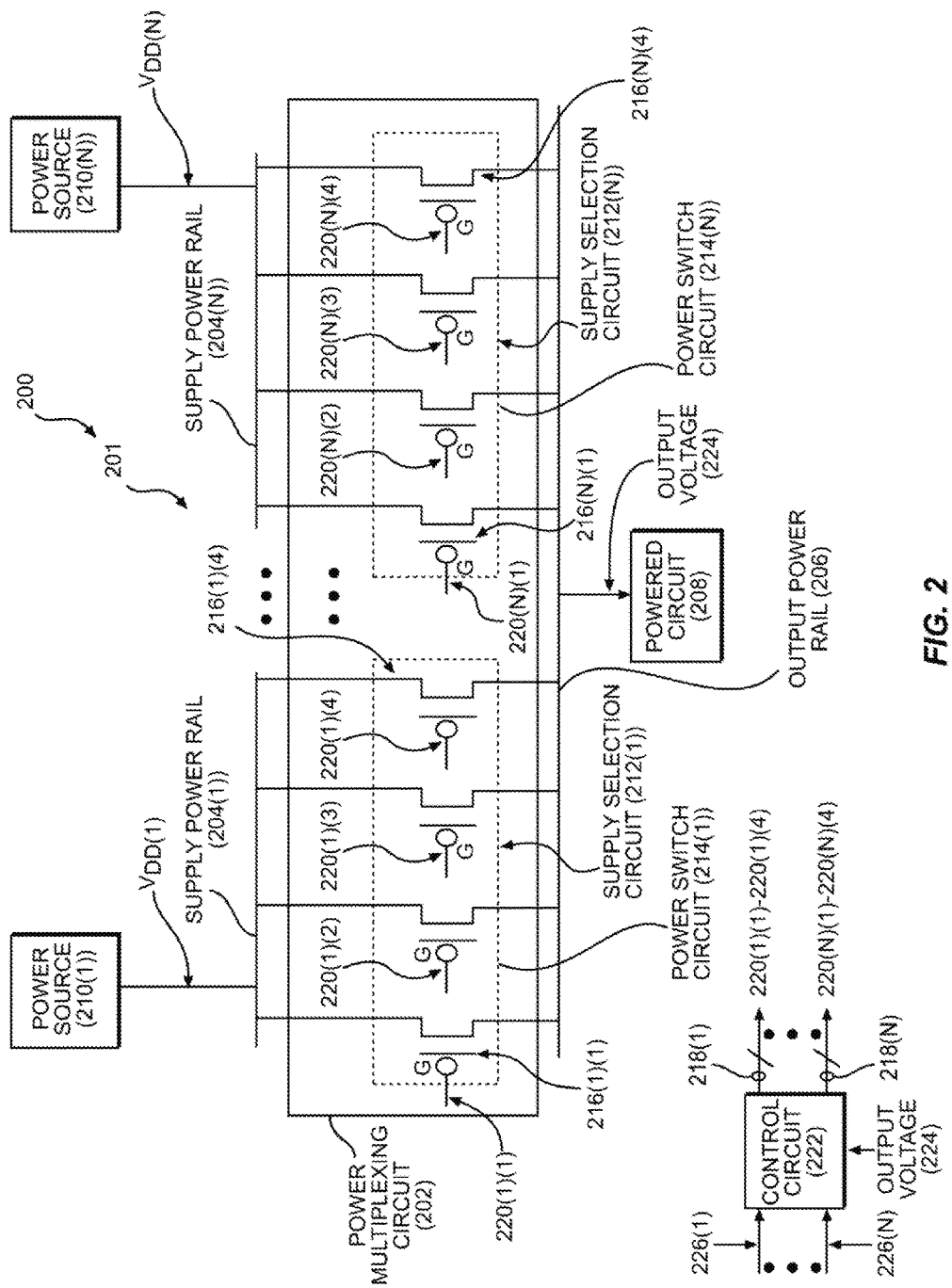
FIG. 2 is a block diagram of an exemplary power multiplexing system that is configured to adaptively control drive strength of multiplexed power from a plurality of supply power rails to an output power rail to power a powered circuit based on an output voltage at the output power rail that can account for performance variations.

FIG. 2 is a block diagram of an exemplary power multiplexing system 200 that is configured to adaptively control drive strength of multiplexed power from supply power rails to a powered circuit. For example, the power multiplexing system 200 may be provided in a system-on-a-chip (SoC) 201. The power multiplexing system 200 includes a power multiplexing circuit 202. As will be discussed in more detail below, the power multiplexing circuit 202 is configured to select one of a plurality of supply power rails 204(1)-204(N) to be coupled to an output power rail 206 to provide power to a powered circuit 208 coupled to the output power rail 206. The supply power rails 204(1)-204(N) are coupled to a respective power source 210(1)-210(N). The power sources 210(1)-210(N) are configured to supply a respective voltage $V_{DD(1)}$-$V_{DD(N)}$ to their respective supply power rail 204(1)-204(N). The power multiplexing circuit 202 is configured to couple one voltage $V_{DD(1)}$-$V_{DD(N)}$ from a respective supply power rail 204(1)-204(N) to the output power rail 206 to provide the voltage $V_{DD(1)}$-$V_{DD(N)}$ to the powered circuit 208 for operation.

For example, the first power source 210(1) may be configured to supply a first voltage $V_{DD(1)}$ (e.g., 1 Volt (V)) that is a higher voltage than a second voltage $V_{DD(N)}$ (e.g., 0.6 V) supplied by the power source 210(N). This supply rail configuration may be provided in the power multiplexing system 200, because it may be desired to couple the powered circuit 208 to a supply power rail that has a higher voltage during a higher operation performance mode, and couple the powered circuit 208 to another supply power rail that has a lower voltage during a lower performance mode to conserve power consumption as an example. For example, the powered circuit 208 may be a memory circuit or array that requires a minimum retention voltage to retain data. The first supply power rail 204(1) may be configured to supply the first voltage $V_{DD(1)}$ capable of exceeding the minimum retention voltage for the powered circuit 208. The second supply power rail 204(N) may be coupled to logic circuits in a logic domain. Thus, if the second voltage $V_{DD(N)}$ is higher than the minimum retention voltage of the powered circuit 208, the power multiplexing system 200 can switch the coupling of second voltage $V_{DD(N)}$ to the output power rail 206 to multiplex the second voltage $V_{DD(N)}$ to the powered circuit 208 for operation. This may have the benefit of avoiding or reducing the need to provide intentional decoupling capacitance in the logic domain. However, if the second voltage $V_{DD(N)}$ is lower than the minimum retention voltage of the powered circuit 208, the power multiplexing system 200 can switch the coupling of the first voltage $V_{DD(1)}$ to the output power rail 206 to provide the first voltage $V_{DD(1)}$ to the powered circuit 208 for operation.

With continuing reference to FIG. 2, to selectively couple a supply power rail 204(1)-204(N) to the output power rail 206 to supply a respective voltage $V_{DD(1)}$-$V_{DD(N)}$ to the powered circuit 208, the power multiplexing circuit 202 includes a plurality of supply selection circuits 212(1)-212(N). The supply selection circuits 212(1)-212(N) are coupled between a respective supply power rail 204(1)-204(N) and the output power rail 206. The power multiplexing system 200 is configured to activate a selected supply selection circuit 212(1)-212(N) to couple a respective supply power rail 204(1)-204(N) to the output power rail 206 to power the powered circuit 208 at the respective voltage $V_{DD(1)}$-$V_{DD(N)}$.

To select a supply power rail 204(1)-204(N) to be coupled to the output power rail 206, the supply selection circuits 212(1)-212(N) in this example include respective power switch circuits 214(1)-214(N). The drive strength of an activated power switch circuit 214(1)-214(N) affects its capacity to drive the voltage $V_{DD(1)}$-$V_{DD(N)}$ onto the output power rail 206. The drive strength of a power switch circuit 214(1)-214(N) adjusts its output impedance, which controls the switching current-resistance (IR) drop, resulting in the desired output voltage. For example, as drive strength of a power switch circuit 214(1)-214(N) is increased, output impedance of the power switch circuit 214(1)-214(N) is decreased, thus reducing the IR drop and increasing the output voltage. If drive strength of a power switch circuit 214(1)-214(N) is decreased, output impedance of the power switch circuit 214(1)-214(N) is increased, thus increasing the IR drop and decreasing the output voltage. PVT variations can also affect drive strength. Drive strength can be increased to compensate for reduced drive strength due to PVT variations for example. However, increasing drive strength increases leakage power. Thus, the power multiplexing system 200 provides for the ability to selectively control the drive strength of the supply selection circuits 212(1)-212(N), which can be used to compensate for PVT variations. Drive strength margin may be reduced as a result, thus reducing leakage power while still attaining the desired drive strength on the output power rail 206.

Thus, in this example, to provide for the ability to control the drive strength of the activated supply selection circuits 212(1)-212(N), each of the power switch circuits 214(1)-214(N) includes four (4) parallel-connected P-type metal oxide semiconductor (MOS) (PMOS) transistors 216(1)(1)-216(1)(4) and 216(N)(1)-216(N)(4) (N-type MOS (NMOS) transistors could also be employed) coupled between a respective supply power rail 204(1)-204(N) and the output power rail 206. Each of the parallel-connected PMOS transistors 216(1)(1)-216(1)(4) and 216(N)(1)-216(N)(4) has an associated drive strength to drive the respective voltage $V_{DD(1)}$-$V_{DD(N)}$ onto the output power rail 206. Thus, to control the overall drive strength of the supply selection circuit 212(1)-212(N), the respective parallel-connected PMOS transistors 216(1)(1)-216(1)(4) and 216(N)(1)-216(N)(4) are individually controlled to be activated or deactivated to contribute towards driving the respective voltage $V_{DD(1)}$-$V_{DD(N)}$ onto the output power rail 206. In this example, each of the PMOS transistors 216(1)(1)-216(1)(4) and 216(N)(1)-216(N)(4) is configured to receive an associated drive strength indicator 218(1)-218(N) in the form of respective power switch selection signals 220(1)(1)-220(1)(4)-220(N)(1)-220(N)(4). Thus, the drive strength indicators 218(1)-218(N) can be thought of in one example as code words each with individual signals or bits indicating an enable state of the respective individual power switch selection signals 220(1)(1)-220(1)(4)-220(N)(1)-220(N)(4) forming the code words to control the respective number of parallel-connected PMOS transistors 216(1)(1)-216(1)(4) and 216(N)(1)-216(N)(4) that are activated.

In this example, the power switch selection signals 220(1)(1)-220(1)(4)-220(N)(1)-220(N)(4) are coupled to gates G of the respective PMOS transistors 216(1)(1)-216(1)(4) and 216(N)(1)-216(N)(4). Thus, the state of the power switch selection signals 220(1)(1)-220(1)(4)-220(N)(1)-220(N)(4) controls whether their respective PMOS transistors 216(1)(1)-216(1)(4) and 216(N)(1)-216(N)(4) are selectively activated, and thus contribute to driving the respective voltage $V_{DD(1)}$-$V_{DD(N)}$ onto the output power rail 206. If the state of the power switch selection signals 220(1)(1)-220(1)(4)-220(N)(1)-220(N)(4) is a power switch selection enable state, which in this example is a logic low level ('0') to activate (i.e., turn-on) the PMOS transistors 216(1)(1)-216(1)(4) and 216(N)(1)-216(N)(4), the respective PMOS transistors 216(1)(1)-216(1)(4) and 216(N)(1)-216(N)(4) will be activated to provide a current flow path between the respective supply power rail 204(1)-204(N) and the output power rail 206. If the state of the power switch selection signals 220(1)(1)-220(1)(4)-220(N)(1)-220(N)(4) is a power switch selection disable state, the respective PMOS transistors 216(1)(1)-216(1)(4) and 216(N)(1)-216(N)(4) will be deactivated to not provide a current flow path between the respective supply power rail 204(1)-204(N) and the output power rail 206.

In this example, to provide for adaptively controlling the drive strength of an activated supply selection circuit 212(1)-212(N) coupling a respective supply power rail 204(1)-204(N) to the output power rail 206, a control circuit 222 is provided in the power multiplexing system 200. The control circuit 222 is configured to generate the drive strength indicators 218(1)-218(N), which in this example are the individual, respective power switch selection signals 220(1)(1)-220(1)(4)-220(N)(1)-220(N)(4). In this example, the PMOS transistors 216(1)(1)-216(1)(4) and 216(N)(1)-216(N)(4) also act as power head switches, so the control circuit 222 controls the power switch selection enable and disable states of each of the drive strength indicators 218(1)-218(N) to control which supply selection circuit 212(1)-212(N) is coupled to the output power rail 206, as well as which individual PMOS transistors 216(1)(1)-216(1)(4) and 216(N)(1)-216(N)(4) are activated and deactivated with activated supply selection circuits 212(1)-212(N) to control drive strength. In this regard, the individual PMOS transistors 216(1)(1)-216(1)(4) and 216(N)(1)-216(N)(4) in the respective power switch circuits 214(1)-214(N) receive respective power switch selection signals 220(1)(1)-220(1)(4)-220(N)(1)-220(N)(4) to indicate the drive strength of the activated supply selection circuit 212(1)-212(N). The activated PMOS transistors 216(1)(1)-216(1)(4) and 216(N)(1)-216(N)(4) contribute towards driving the voltage $V_{DD(1)}$-$V_{DD(N)}$ onto the output power rail 206.

The control circuit 222 is configured to adaptively control the drive strength of the activated supply selection circuit 212(1)-212(N) based on the performance of the power multiplexing system 200. In this manner, the drive strength of the activated supply selection circuit 212(1)-212(N) can be adjusted during operation to account for operational and/or PVT variations. Thus, instead of providing a fixed drive strength that may waste drive strength margin required to achieve the desired performance of the power multiplexing system 200, the ability to adaptively adjust the drive strength margin of the activated supply selection circuits 212(1)-212(N) allows drive strength margin to be reduced while achieving the desired performance.

In this regard, with continuing reference to FIG. 2, the control circuit 222 is configured to monitor an output voltage 224 of the output power rail 206. In response to a supply power rail selection indicator 226(1)-226(N) indicating which supply selection circuit 212(1)-212(N) should be activated for coupling the associated supply power rail 204(1)-204(N) to the output power rail 206, the control circuit 222 compares a voltage level of the output voltage 224 on the output power rail 206 to a first predefined output voltage level associated with the supply selection circuit 212(1)-212(N) indicated as activated based on the supply power rail selection indicator 226(1)-226(N). The control circuit 222 is configured to selectively generate the drive strength indicators 218(1)-218(N) based on the comparison of the voltage level of the output voltage 224 on the output power rail 206 to the predefined output voltage level associated with the activated supply selection circuit 212(1)-212(N). Thus, the control circuit 222 can be configured to continually monitor the output voltage 224 on the output power rail 206 to adjust the drive strength of the activated supply selection circuit 212(1)-212(N) based on performance variations of the power multiplexing system 200 observed based on the output voltage 224.

Figure 3:
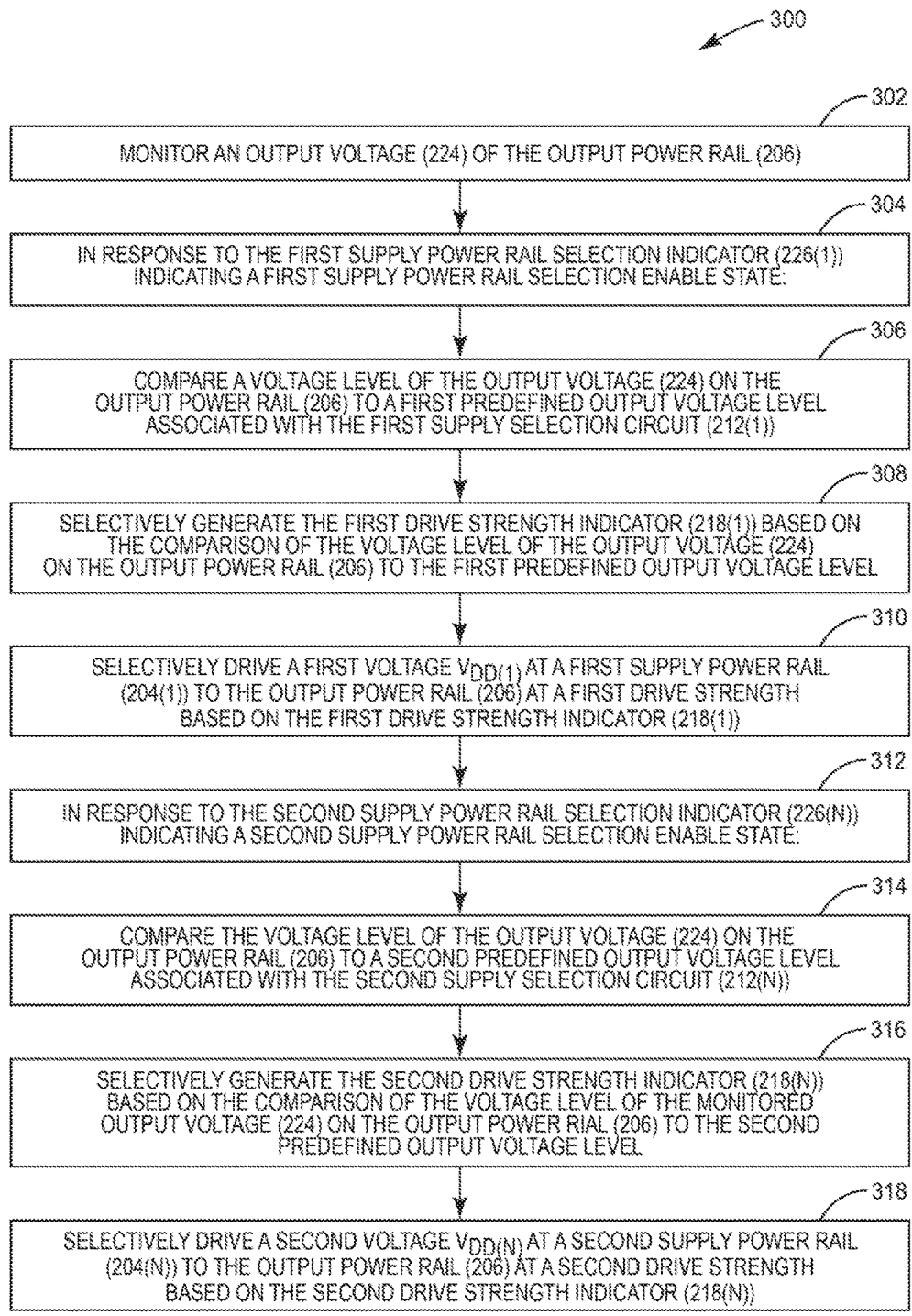
FIG. 3 is a flowchart illustrating an exemplary process of a control circuit in FIG. 2 adaptively controlling drive strength of active supply selection circuits in a power multiplexing circuit in FIG. 2, based on an output voltage at the output power rail.

FIG. 3 is a flowchart illustrating an exemplary process 300 of the control circuit 222 in FIG. 2 adaptively controlling the drive strength of an active supply selection circuit 212(1)-212(N) in the power multiplexing circuit 202, based on an output voltage 224 on the output power rail 206 to account for performance variations. The process 300 in FIG. 3 will be described in regard to the power multiplexing circuit 202 including two (2) supply selection circuits 212(1), 212(N). However, it should be understood that the process 300 in FIG. 3 is also applicable for the power multiplexing circuit 202 including more than two (2) supply selection circuits 212(1), 212(N).

With reference to FIG. 3, the control circuit 222 monitors the output voltage 224 of the output power rail 206 (block 302). In response to the first supply power rail selection indicator 226(1) indicating a first supply power rail selection enable state (block 304), the control circuit 222 compares a voltage level of the output voltage 224 on the output power rail 206 to a first predefined output voltage level associated with the first supply selection circuit 212(1) (block 306). The control circuit 222 then selectively generates the first drive strength indicator 218(1) based on the comparison of the voltage level of the output voltage 224 on the output power rail 206 to the first predefined output voltage level (block 308). In response, the power multiplexing circuit 202 selectively drives the first voltage $V_{DD(1)}$ at the first supply power rail 204(1) to the output power rail 206 at a first drive strength based on the first drive strength indicator 218(1) (block 310). However, in response to the second supply power rail selection indicator 226(N) indicating a second supply power rail selection enable state (block 312), the control circuit 222 compares the voltage level of the output voltage 224 on the output power rail 206 to a second predefined output voltage level associated with the second supply selection circuit 212(N) (block 314). The control circuit 222 selectively generates the second drive strength indicator 218(N) based on the comparison of the voltage level of the output voltage 224 on the output power rail 206 to the second predefined output voltage level (block 316). In response, the power multiplexing circuit 202 selectively drives the second voltage $V_{DD(N)}$ at the second supply power rail 204(N) to the output power rail 206 at a second drive strength based on the second drive strength indicator 218(N) (block 318).

Figure 4A:
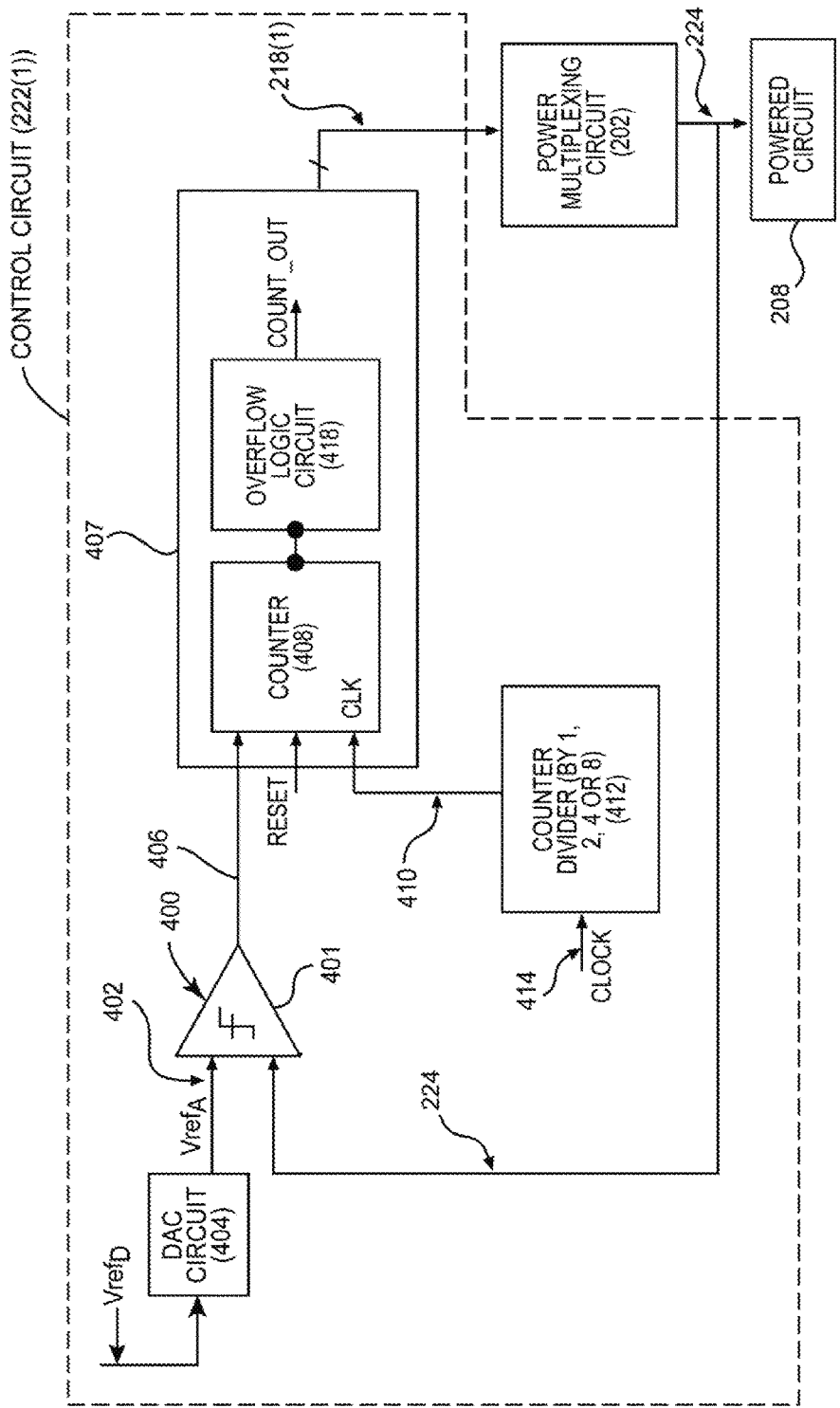
FIG. 4A is a block diagram of an exemplary control circuit that can be included in the power multiplexing system in FIG. 2 to adaptively control the drive strength of an active supply selection circuit in a power multiplexing circuit based on an output voltage at the output power rail.

Different control circuits 222 can be provided in the power multiplexing system 200 in FIG. 2 to adaptively control the drive strength of the voltage $V_{DD(1)}$-$V_{DD(N)}$ driven to the output power rail 206. In this regard, FIG. 4A is a block diagram of an exemplary control circuit 222(1) that can be provided as the control circuit 222 in the power multiplexing system 200 in FIG. 2, for example, to adaptively control the drive strength of an active supply selection circuit 212(1)-212(N) based on the output voltage 224 on the output power rail 206 to account for performance variations. The control circuit 222(1) in FIG. 4A is shown as only controlling one (1) supply selection circuit 212(1)-212(N), and thus multiple control circuits 222(1) would be provided to control the drive strength of each supply selection circuit 212(1)-212(N). However, note that the control circuit 222(1) could be adapted to control the drive strength of each of the supply selection circuits 212(1)-212(N). The control circuit 222(1) illustrated in FIG. 4 is for controlling one (1) supply selection circuit 212(1) in the power multiplexing circuit 202.

In this regard, with reference to FIG. 4A, the output voltage 224 is coupled to a comparator circuit 400 provided in the form of an analog comparator 401 in this example. The comparator circuit 400 also receives, as input, a reference output voltage $Vref_A$ 402 for the supply selection circuit 212(1). The reference output voltage 402 may have been stored as a digital reference output voltage $Vref_D$ and converted to an analog signal as the reference output voltage $Vref_A$ by a digital-to-analog converter (DAC) circuit 404. The comparator circuit 400 is configured to generate a comparison output signal 406 indicating a greater than or less than comparison in voltage level between the output voltage 224 and the reference output voltage 402 to determine the performance of the power multiplexing circuit 202. The comparison output signal 406 is provided to a counter circuit 407 that includes a counter 408 configured to increment or decrement a count value when the output voltage 224 drops below or above the reference output voltage 402, respectively (or vice versa). The counter 408 may be clocked by a clock signal 410 that is divided by a clock divider 412 from a main clock signal 414 such that the counter 408 is activated for each clock cycle of the clock signal 410. An overflow logic circuit 418 is provided to handle overflow conditions of the counter 408. The counter 408 outputs the count value in the form of the drive strength indicator 218(1) to be provided to the power multiplexing circuit 202 (and the activated supply selection circuit 212(1)) to control the drive strength of the supply selection circuit 212(1).

The control circuits 222(1) in FIG. 4A can ensure that the voltage at the output power rail 206 does not drop below a designed minimum threshold voltage. The counter 408 can count up or down to account for changes in environmental conditions, such as temperature drifts, work load changes, etc.

Figure 4B:
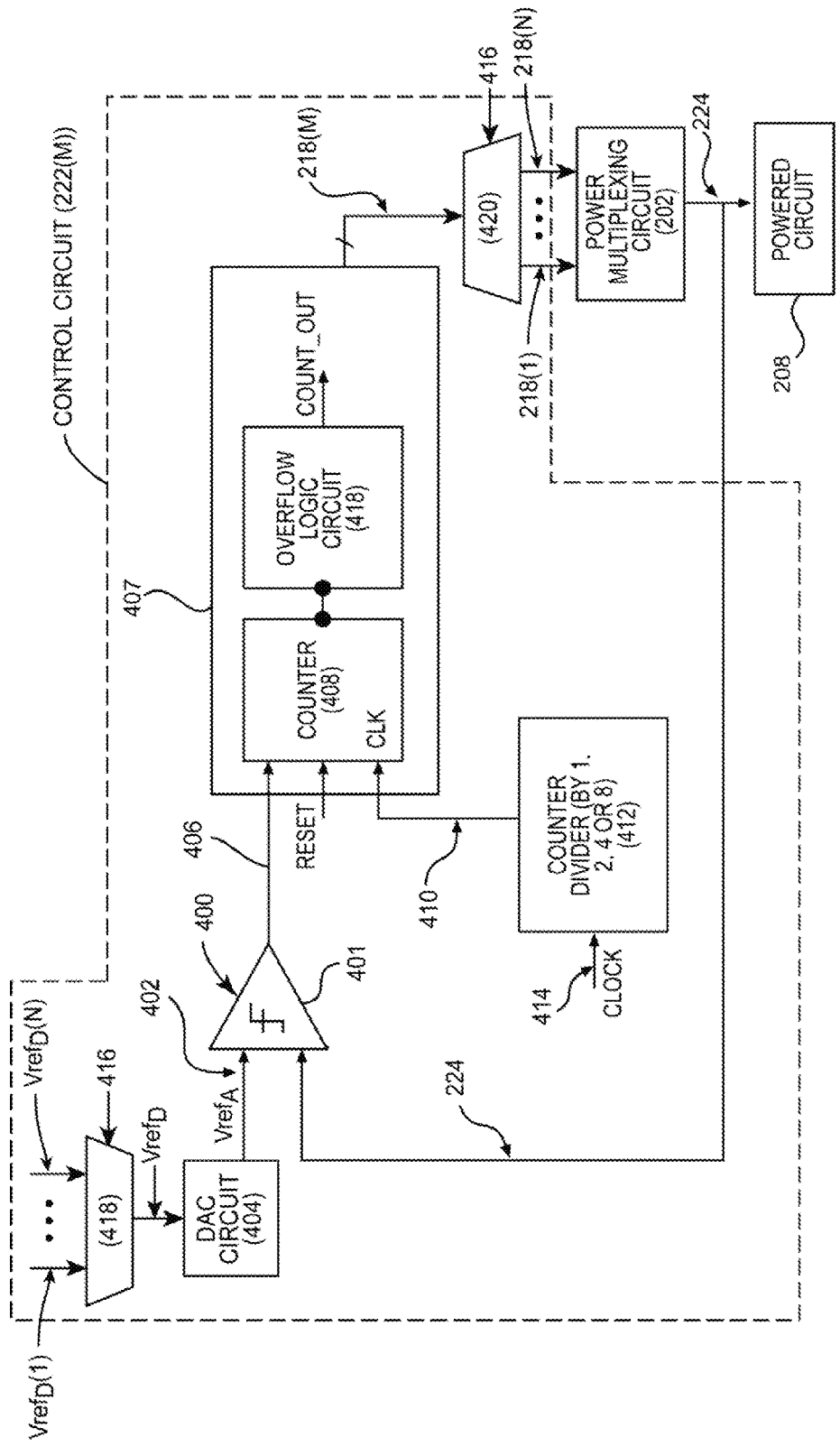
FIG. 4B is a block diagram of another exemplary control circuit that can be included in the power multiplexing system in FIG. 2 to adaptively control the drive strength of an active supply selection circuit in a power multiplexing circuit based on an output voltage at the output power rail.

Alternatively, as shown in FIG. 4B, a shared control circuit 222M could be provided that is multiplexed to be able to control any of the supply selection circuits 212(1)-212(N). This control circuit 222M is configured to output any power switch selection signals 220(1)(1)-220(1)(4)-220(N)(1)-220(N)(4) for a selected supply selection circuit 212(1)-212(N). The control circuit 222M in FIG. 4B has common components with the control circuit 222(1) in FIG. 4A, which are shown with common element numbers. As shown in FIG. 4B, the comparator circuit 400 receives, as input, the reference output voltage $Vref_A$ 402 for a selected supply selection circuit 212(1)-212(N). A selection signal 416 input into a multiplexing circuit 418 controls which digital reference output voltage $Vref_D(1)$-$Vref_D(N)$ for a selected supply selection circuit 212(1)-212(N) is passed to the DAC circuit 404 as the reference output voltage $Vref_A$ 402. A demultiplexing circuit 420 is provided to control to which supply selection circuit 212(1)-212(N) in the power multiplexing circuit 202, the drive strength indicator 218 is provided to control the drive strength of the selected supply selection circuit 212(1)-212(N).

Figure 5:
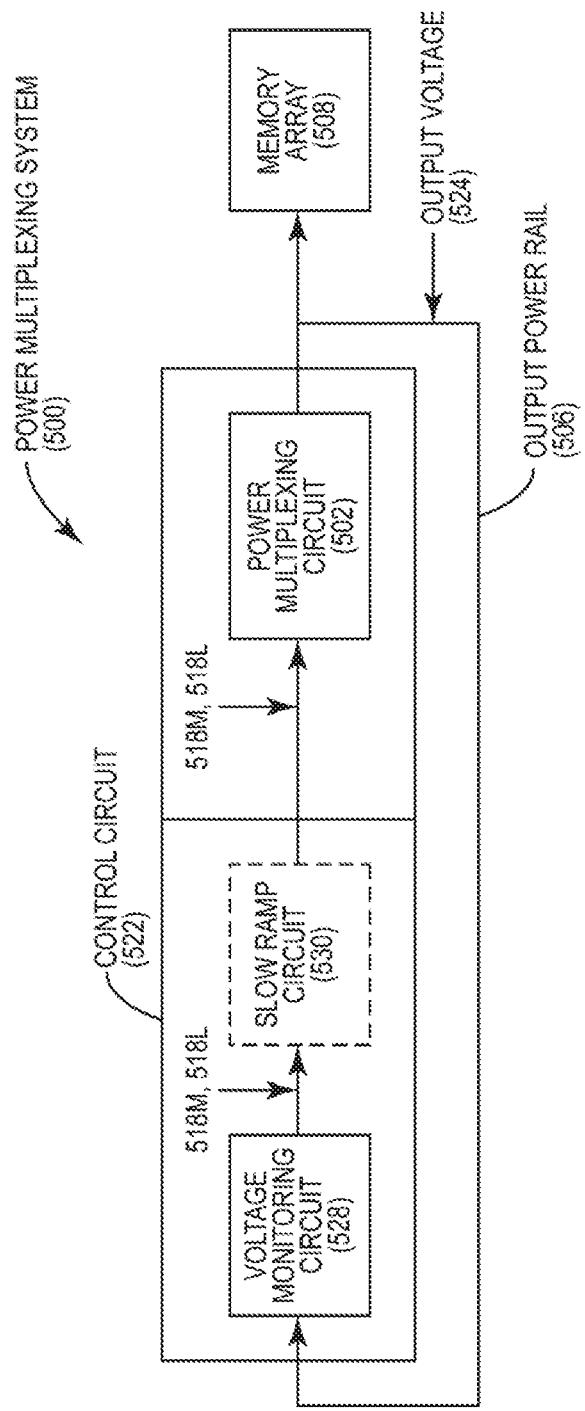
FIG. 5 is a block diagram of another exemplary power multiplexing system that is configured to adaptively control drive strength of multiplexed power from a plurality of supply power rails to an output power rail to power a powered circuit based on an output voltage at the output power rail that can account for performance variations.

Other types of control circuits can be provided in a power multiplexing system, like the power multiplexing system 200 in FIG. 2, to adaptively control the drive strength of a multiplexed voltage driven to an output power rail. For example, FIG. 5 is a block diagram of another exemplary power multiplexing system 500 that is configured to adaptively control the drive strength of multiplexed power from a plurality of supply power rails to an output power rail to power a powered circuit based on an output voltage at the output power rail that can account for performance variations. As shown therein, a control circuit 522 is provided to adaptively control the drive strength of a multiplexed voltage driven by a power multiplexing circuit 502 as an output voltage 524 on an output power rail 506 to power a powered circuit, which is shown as a memory array 508 in this example. The control circuit 522 in this example includes a voltage monitoring circuit 528 configured to monitor the output voltage 524 to adjust the drive strength of the output voltage 524 multiplexed on the output power rail 506 to account for monitored performance variations. The control circuit 522 also includes an optional slow ramp circuit 530 that is configured to gradually ramp up the memory and logic drive strength indicators 518M, 518L in a controlled manner, which in turn gradually ramps up multiplexed power switch circuits to ramp up the voltage multiplexed on the output power rail 506. This may reduce or avoid in-rush current related supply noise in the power multiplexing system 500, thus avoiding or mitigating performance loss of the memory array 508 due to switching of power rails.

Figure 6:
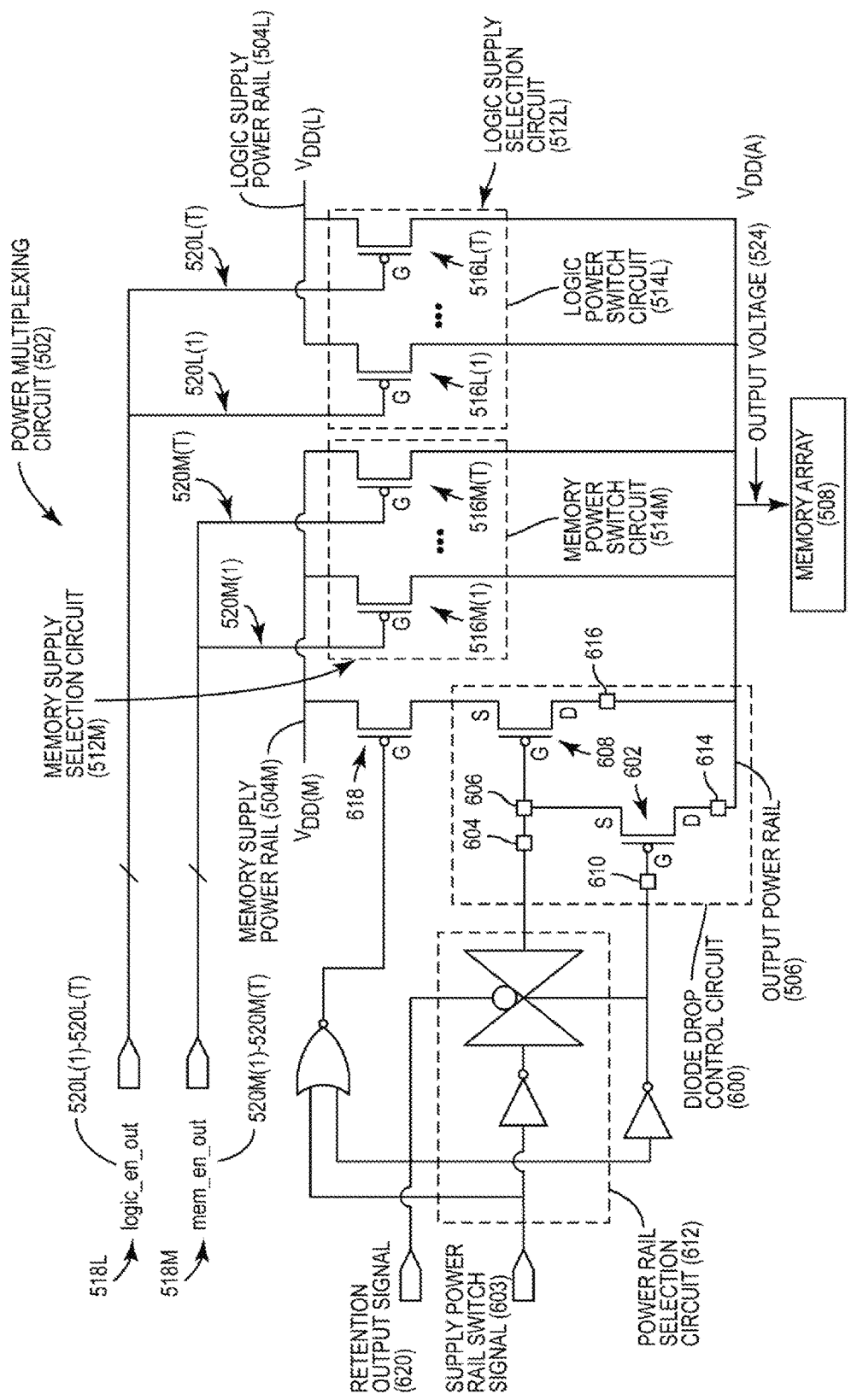
FIG. 6 is a block diagram of an exemplary power multiplexing circuit that can be included in the power multiplexing system of FIG. 5, wherein the power multiplexing circuit additionally includes a diode drop control circuit configured to be activated to provide a diode drop connection between a multiplexed supply power rail and the output power rail, in response to switching the coupling of the output power rail to a different selected supply power rail.

FIG. 6 is a block diagram of the exemplary power multiplexing circuit 502 in the power multiplexing system 500 of FIG. 5. The power multiplexing circuit 502 is configured to multiplex coupling of one of a logic supply power rail 504L and a memory supply power rail 504M to the output power rail 506 to provide power to the memory array 508 coupled to the output power rail 506. The logic supply power rail 504L and the memory supply power rail 504M are coupled to respective power sources supplying a memory voltage $V_{DD(M)}$ or in a memory domain and a logic voltage $V_{DD(L)}$ in a logic domain. To selectively couple the logic supply power rail 504L or the memory supply power rail 504M to the output power rail 506 to supply a respective memory voltage $V_{DD(M)}$ logic voltage $V_{DD(L)}$ to the memory array 508, the power multiplexing circuit 502 includes memory and logic supply selection circuits 512M, 512L. The memory and logic supply selection circuits 512M, 512L are coupled between the respective memory supply power rail 504M and logic supply power rail 504L. The power multiplexing system 500 is configured to activate one of the memory and logic supply selection circuits 512M, 512L to couple a respective memory supply power rail 504M and logic supply power rail 504L to the output power rail 506 to power the memory array 508 at the respective memory voltage $V_{DD(M)}$ and logic voltage $V_{DD(L)}$.

To select the memory supply power rail 504M and logic supply power rail 504L to be coupled to the output power rail 506, the memory and logic supply selection circuits 512M, 512L in this example each include respective memory and logic power switch circuits 514M, 514L. The drive strength of an activated memory or logic power switch circuit 514M, 514L affects its capacity to drive the respective memory or logic voltage $V_{DD(M)}$, $V_{DD(L)}$ onto the output power rail 506. The drive strength of an activated memory or logic power switch circuit 514M, 514L adjusts its output impedance, which controls switching a current-resistance (IR) drop across the memory or logic power switch circuit 514M, 514L, resulting in the desired output voltage. For example, as drive strength of a memory or logic power switch circuit 514M, 514L is increased, output impedance of the memory or logic power switch circuit 514M, 514L is decreased, thus reducing the IR drop and the respective memory or logic voltage $V_{DD(M)}$, $V_{DD(L)}$ driven onto the output power rail 506. If however, the drive strength of a memory or logic power switch circuit 514M, 514L is decreased, output impedance of the memory or logic power switch circuit 514M, 514L is increased, thus increasing the IR drop and decreasing the respective memory or logic voltage $V_{DD(M)}$, $V_{DD(L)}$ driven onto the output power rail 506. PVT variations can affect drive strength. Drive strength can be increased for example to compensate for PVT variations. However, increasing drive strength increases leakage power. Thus, the power multiplexing system 500 provides for the ability to selectively control the drive strength of the memory and logic supply selection circuits 512M, 512L which can be used to compensate for PVT variations that may reduce drive strength. Drive strength margin may be reduced as a result, thus reducing leakage power while still attaining the desired drive strength on the output power rail 506.

In this example, to provide for the ability to control the drive strength of the activated memory and logic supply selection circuits 512M, 512L, each of the memory and logic power switch circuits 514M, 514L includes a plurality of parallel-connected PMOS transistors 516M(1)-516M(T) and 516L(1)-516L(T), where 'T' represents the desired number of PMOS transistors 516 to include. Note that NMOS transistors could also be employed. The PMOS transistors 516M(1)-516M(T) and 516L(1)-516L(T) are coupled between a respective memory and logic supply power rail 504M, 504L and the output power rail 506. Each of the parallel-connected PMOS transistors 516M(1)-516M(T) and 516L(1)-516L(T) has an associated drive strength to drive the respective memory or logic voltage $V_{DD(M)}$, $V_{DD(L)}$ onto the output power rail 506. Thus, to control the overall drive strength of the memory and logic supply selection circuits 512M, 512L, the respective parallel-connected PMOS transistors 516M(1)-516M(T) and 516L(1)-516L(T) can be individually controlled to be activated or deactivated to contribute towards driving the respective memory or logic voltage $V_{DD(M)}$, $V_{DD(L)}$ onto the output power rail 506. In this example, each of the PMOS transistors 516M(1)-516M(T) and 516L(1)-516L(T) is configured to receive an associated memory or logic drive strength indicator 518M, 518L in the form of respective memory and logic power switch selection signals 520M(1)-520M(T), 520L(1)-520L(T). Thus, the memory and logic drive strength indicators 518M, 518L can be thought of in one example as code words each with individual signals or bits indicating an enable state of the respective individual memory and logic power switch selection signals 520M(1)-520M(T), 520L(1)-520L(T) forming the code words to control the respective number of parallel-connected PMOS transistors 516M(1)-516(1)(T) and 516L(1)-516L(T) that are activated.

In this example, the memory and logic power switch selection signals 520M(1)-520M(T), 520L(1)-520L(T) are coupled to gates G of the respective PMOS transistors 516M(1)-516M(T) and 516L(1)-516L(T). Thus, the state of the memory and logic power switch selection signals 520M(1)-520M(T), 520L(1)-520L(T) controls whether their respective PMOS transistors 516M(1)-516M(T) and 516L(1)-516L(T) are selectively activated, and thus contribute to driving the respective memory and logic voltages $V_{DD(M)}$, $V_{DD(L)}$ onto the output power rail 506. If the state of the memory or logic power switch selection signals 520M(1)-520M(T), 520L(1)-520L(T) is a power switch selection enable state, which in this example is a logic low level ('0'), the respective PMOS transistors 516M(1)-516M(T) and 516L(1)-516L(T) will be activated to provide a current flow path between the respective memory or logic supply power rail 504M, 504L and the output power rail 506. If the state of the memory or logic power switch selection signals 520M(1)-520M(T), 520L(1)-520L(T) is a power switch selection disable state, the respective PMOS transistors 516M(1)-516M(T) and 516L(1)-516L(T) will be deactivated to not provide a current flow path between the respective memory and logic supply power rail 504M, 504L and the output power rail 506.

With continuing reference to FIG. 6, to maintain the memory voltage $V_{DD(M)}$ at the output power rail 506 to power the memory array 508 during switching of the coupling of the output power rail 506 from the memory supply power rail 504M to the logic supply power rail 504L, but while also avoiding creating a current cross-conduction path between the memory and logic supply power rails 504M, 504L, the power multiplexing circuit 502 also includes a diode drop control circuit 600. The diode drop control circuit 600 is provided in the form of a PMOS transistor 602 in this example. The diode drop control circuit 600 is configured to be activated to create a diode drop connection between a respective memory supply power rail 504M and the output power rail 506 for a diode drop operation mode in response to switching of the coupling of the memory supply power rail 504M to the logic supply power rail 504L, to the output power rail 206. In this regard, the diode drop control circuit 600 is configured to receive a supply power rail switch signal 603 indicating a supply power rail switch state to the logic supply power rail 504L. In response to the supply power rail switch signal 603 indicating a supply power rail switch enable state to the logic supply power rail 504L, the diode drop control circuit 600 establishes a diode drop connection between the memory supply power rail 504M and the output power rail 506 in a diode drop operation mode.

More specifically, in this example, the diode drop control circuit 600 includes a diode drop input 604 coupled to a first power rail selection input 606 of a first power switch circuit 608. The diode drop control circuit 600 also includes a diode drop control input 610 coupled to gate G of the PMOS transistor 602 configured to receive the supply power rail switch signal 603 from a power rail selection circuit 612. The diode drop control circuit 600 also includes a diode drop output 614 coupled to drain D of the PMOS transistor 602 and coupled to a first power output 616 of the power switch circuit 608. The diode drop control circuit 600 is configured to establish a diode drop connection in a diode drop operation mode between the power rail selection input 606 and the power output 616, in response to the supply power rail switch signal 603 indicating the supply power rail switch enable state from the memory supply power rail 504M to the logic supply power rail 504L. A retention output signal 620 controls the passing of the supply power rail switch signal 603 to the diode drop input 604. Also in response to the supply power rail switch signal 603 indicating the supply power rail switch enable state from the memory supply power rail 504M to the logic supply power rail 504L, the power rail selection circuit 612 is deactivated to present a high impedance to the power rail selection input 606. Thus, in the diode drop operation mode, the gate G and the drain D of a head switch PMOS transistor 618 is coupled together to put the first head switch PMOS transistor 618 in a diode drop configuration.

In this example, current cross-conduction can only occur in one direction between the memory supply power rail 504M with the higher memory voltage $V_{DD(M)}$ to the logic supply power rail 504L with the lower logic voltage $V_{DD(L)}$. Thus, the diode drop control circuit 600 is configured to regulate the voltage on the output power rail 506 in a forward bias configuration in this example. For example, with the memory voltage $V_{DD(M)}$ on the memory supply power rail 504M being higher than the logic voltage $V_{DD(L)}$ on the logic supply power rail 504L, the diode drop control circuit 600 will be in a forward bias configuration. The diode drop control circuit 600 is configured to allow current to flow from the memory supply power rail 504M to the output power rail 506 to maintain an output voltage $V_{DD(A)}$ on the output power rail 506. In one example, the diode drop control circuit 600 is configured to regulate the output voltage $V_{DD(A)}$ on the output power rail 506 to a threshold voltage of the diode drop control circuit 600 less than the memory voltage $V_{DD(M)}$. As the output voltage $V_{DD(A)}$ on the output power rail 506 discharges to the threshold voltage of the diode drop control circuit 600 less than the memory voltage $V_{DD(M)}$, the diode drop control circuit 600 will allow current to flow to maintain the voltage (e.g., 0.8 V) to a threshold voltage (e.g., 0.2 V) of the diode drop control circuit 600 less than the memory voltage $V_{DD(M)}$ (e.g., 1 V). In this manner, the output voltage $V_{DD(A)}$ is continuously provided to the memory array 508 during the diode drop operation mode even when switching the coupling of the memory supply power rail 504M to the logic supply power rail 504L, to the output power rail 506, but without creating a current cross-conduction path between the memory supply power rail 504M to the logic supply power rail 504L. To reduce power consumption during the diode drop operation mode, the memory array 508 may be configured to be in a retention or reduced power consumption state where only leakage currents are drawn from the output power rail 506 in a non-limiting example.

After the switching of the coupling of the memory supply power rail 504M to the logic supply power rail 504L, to the output power rail 506, the diode drop operation mode can be discontinued. In this regard, the supply power rail switch signal 603 is controlled to indicate a supply power rail switch disable state. In response, the diode drop control circuit 600 disconnects the diode drop connection between the memory supply power rail 504M and the output power rail 506. A current cross-conduction path is not created when the diode drop operation mode is discontinued, because only either the memory drive strength indicator 518M or the logic drive strength indicator 518L is controlled to be in a power rail selection enable state to select only the memory power switch circuit 514M or the logic power switch circuit 514L to couple either the memory or logic supply power rail 504M, 504L to the output power rail 506 at any given time outside of the diode drop operation mode.

Figure 7:
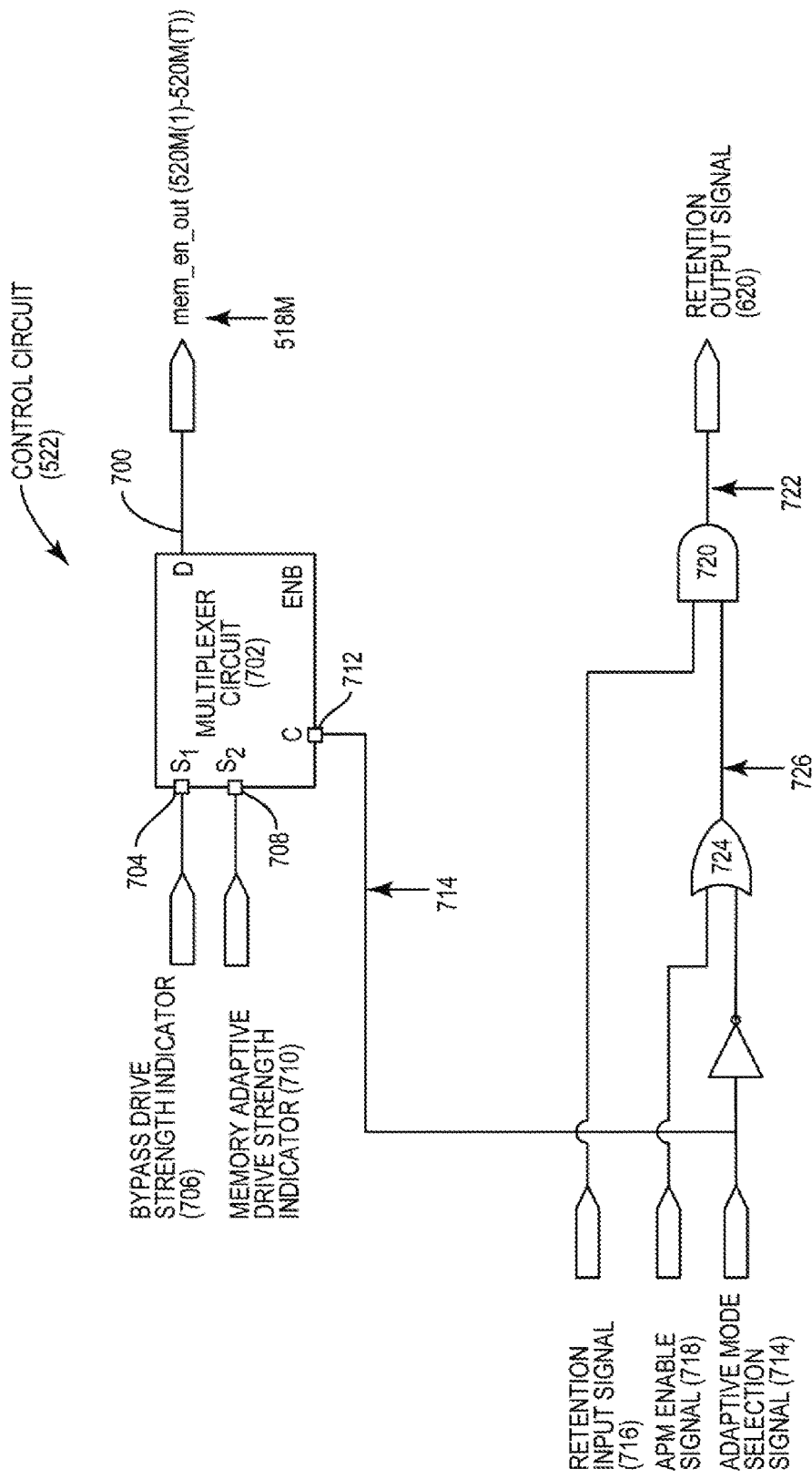
FIG. 7 is a block diagram of another exemplary control circuit that can be included in the power multiplexing system of FIG. 5 to adaptively control the drive strength of an active supply selection circuit and a diode drop control circuit in a power multiplexing circuit.

FIG. 7 is a block diagram of the control circuit 522 that can be included in the power multiplexing system 500 of FIG. 5 to adaptively control the drive strength of an active memory or logic supply selection circuit 512M, 512L and the diode drop control circuit 600 in the power multiplexing circuit 502 in FIG. 6. The control circuit 522 is configured to provide the operational modes illustrated in a logic table 800 in FIG. 8. Both will be discussed in conjunction with each other below.

With reference to FIG. 7, the memory drive strength indicator 518M is provided as an output 700 of a multiplexer circuit 702. The multiplexer circuit 702 includes a first input 704 configured to receive a first bypass drive strength indicator 706, and a second input 708 configured to receive a memory adaptive drive strength indicator 710. The multiplexer circuit 702 is controlled to pass the bypass drive strength indicator 706 to the memory drive strength indicator 518M if it is desired to bypass the adaptive drive strength operation of the power multiplexing circuit 502 when coupling the memory supply power rail 504M to the output power rail 506 in FIG. 6. For example, the bypass drive strength indicator 706 may be a fixed setting for each of the memory power switch selection signals 520M(1)-520M(T) such as all activated (e.g., all logical '0') for example or any other fixed setting. In this manner, the drive strength of the memory voltage $V_{DD(M)}$ is not varied. The multiplexer circuit 702 is also configured to be controlled to pass the memory adaptive drive strength indicator 710 to the memory drive strength indicator 518M if it is desired to adaptively control the drive strength operation of the power multiplexing circuit 502 when coupling the memory supply power rail 504M to the output power rail 506 in FIG. 6. For example, the memory adaptive drive strength indicator 710 may be the counter output of the memory drive strength indicator 218(1) in the control circuit 222(1) in FIG. 4A as one example. The memory adaptive drive strength indicator 710 will control the memory power switch selection signals 520M(1)-520M(T) to control which PMOS transistors 516M(1)-516M(T) in FIG. 5 are activated.

With continuing reference to FIG. 7, the multiplexer circuit 702 also includes a selection input 712 configured to receive an adaptive mode selection signal 714 to control whether the bypass drive strength indicator 706 from the first input 704 or the memory adaptive drive strength indicator 710 from the second input 708 is passed to the output 700 as the memory drive strength indicator 518M. In this regard, if the adaptive mode selection signal 714 is in an adaptive mode disable state, the multiplexer circuit 702 passes the bypass drive strength indicator 706 from the first input 704 to the output 700. If the adaptive mode selection signal 714 is in an adaptive mode enable state, the multiplexer circuit 702 passes the memory adaptive drive strength indicator 710 from the second input 708 to the output 700. If the adaptive mode selection signal 714 is logical low (i.e., logical '0'), this causes the multiplexer circuit 702 to output the bypass drive strength indicator 706 from the first input 704 to the output 700 as the memory drive strength indicator 518M. If the adaptive mode selection signal 714 is logical high (i.e., logical '1') in this example, the adaptive mode selection signal 714 is in an adaptive mode enable state in this example to provide adaptive control of drive strength.

To control the diode drop mode operation explained in the control circuit 522 in FIG. 6, the control circuit 522 in FIG. 7 is also configured to control generating the retention output signal 620. As previously discussed above in FIG. 6, the retention output signal 620 is configured to control whether the supply power rail switch signal 603 is passed. If the adaptive mode selection signal 714 is logical low (i.e., logical '0') to cause the multiplexer circuit 702 to output the bypass drive strength indicator 706 from the first input 704 to the output 700 as the memory drive strength indicator 518M, a retention input signal 716 and adaptive power multiplexing (APM) enable signal 718 are in don't care states (x), because an AND-based gate 720 in FIG. 7 will pass the retention input signal 716 to an output 722 for the retention output signal 620. This is also shown in the logic table 800 in FIG. 8 for the "ASR Bypass" state where the adaptive mode selection signal 714 is logical '0'. Thus, the retention input signal 716 will control whether the supply power rail switch signal 603 is passed to the diode drop control circuit 600.

In a "Collapse" state as shown in the logic table 800 in FIG. 8, the adaptive mode selection signal 714 is set to a logical "1" to be in the adaptive mode enable state with the APM enable signal 718 and the retention input signal 716 set to logical '0'. This causes multiplexer circuit 702 to provide the bypass drive strength indicator 706 from the first input 704 to the output 700 as the memory drive strength indicator 518M. An OR-based gate 724 will generate a logical '0' on its output 726 to an AND-based gate 720 to generate a logical '0' for the retention output signal 620 to deactivate the diode drop operation of the diode drop control circuit 600.

As shown in FIG. 8, to set up for adaptively controlling the drive strength of the multiplexed memory power $V_{DD(M)}$ onto the output power rail 506 in FIG. 5, an "ASR Enable" state provides for the adaptive mode selection signal 714 to be set to a logical "1" to be in the adaptive mode enable state. This causes the multiplexer circuit 702 to provide the bypass drive strength indicator 706 from the first input 704 to the output 700 as the memory drive strength indicator 518M. The APM enable signal 718 is set to a logical '0' and the retention input signal 716 is set to a logical '1'. This causes the AND-based gate 720 to output a logical '0' as the retention output signal 620 to disable the diode drop mode operation of the diode drop control circuit 600. Then, as shown in FIG. 8, for a "Functional" state for adaptively controlling the memory power switch selection signals 520M(1)-520M(T) to control which PMOS transistors 516M(1)-516M(T) in FIG. 5 are activated to control drive strength of the memory voltage $V_{DD(M)}$ from the memory supply power rail 504M coupled to the output power rail 506, the adaptive mode selection signal 714 is set to a logical "1" to be in the adaptive mode enable state. This causes the multiplexer circuit 702 to provide the bypass drive strength indicator 706 from the first input 704 to the output 700 as the memory drive strength indicator 518M. The APM enable signal 718 is set to a logical '1' and the retention input signal 716 is set to a logical '0'. This causes the AND-based gate 720 to output a logical '0' as the retention output signal 620 to disable the diode drop mode operation of the diode drop control circuit 600.

As shown in FIG. 8, in the "Switching Between Supply Power Rails" 504M, 504L state, the adaptive mode selection signal 714 is set to a logical "1" to be in the adaptive mode enable state for adaptively controlling the drive strength of the memory voltage $V_{DD(M)}$ from the memory supply power rail 504M coupled to the output power rail 506. This causes the multiplexer circuit 702 to provide the bypass drive strength indicator 706 from the first input 704 to the output 700 as the memory drive strength indicator 518M. The APM enable signal 718 is set to a logical '1' and the retention input signal 716 is set to a logical '1'. This causes the AND-based gate 720 to output a logical '1' as the retention output signal 620 to enable the diode drop mode operation of the diode drop control circuit 600.

Figure 9:
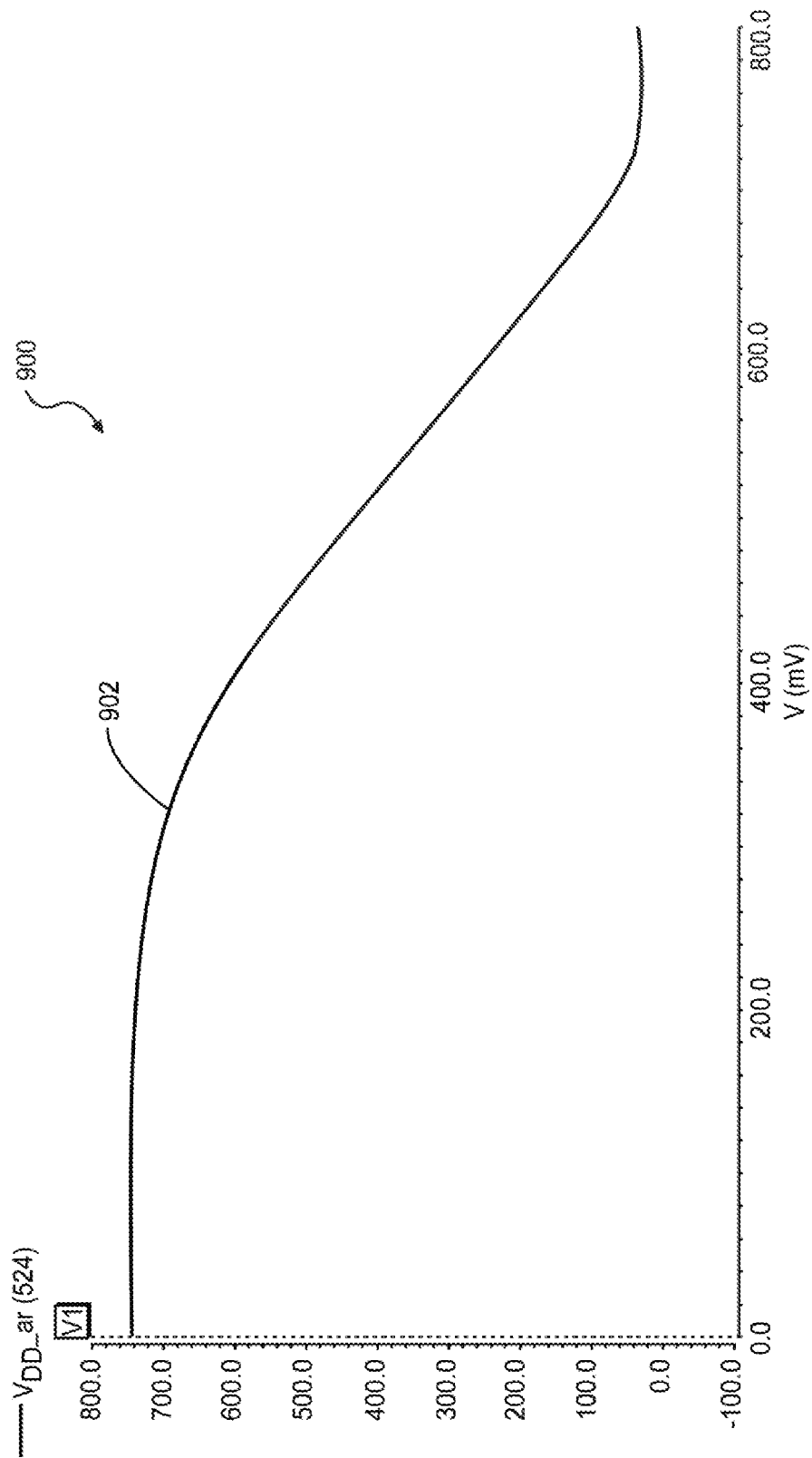
FIG. 9 is a graph illustrating an exemplary plot of supply voltage at a supply power rail transferred to the output power rail in the power multiplexing system in FIG. 5 as a function of drive strength control of the power multiplexing circuit.

FIG. 9 is a graph illustrating an exemplary plot 900 of supply voltage at a supply power rail transferred to the output power rail 506 in the power multiplexing system 500 in FIG. 5 as a function of drive strength control of the power multiplexing circuit 502. As shown therein, voltage curve 902 indicates an example output voltage multiplexed on the output power rail 506 as a function of switching activation of a memory or logic supply selection circuit 512(1)-512(N).

Figure 10:
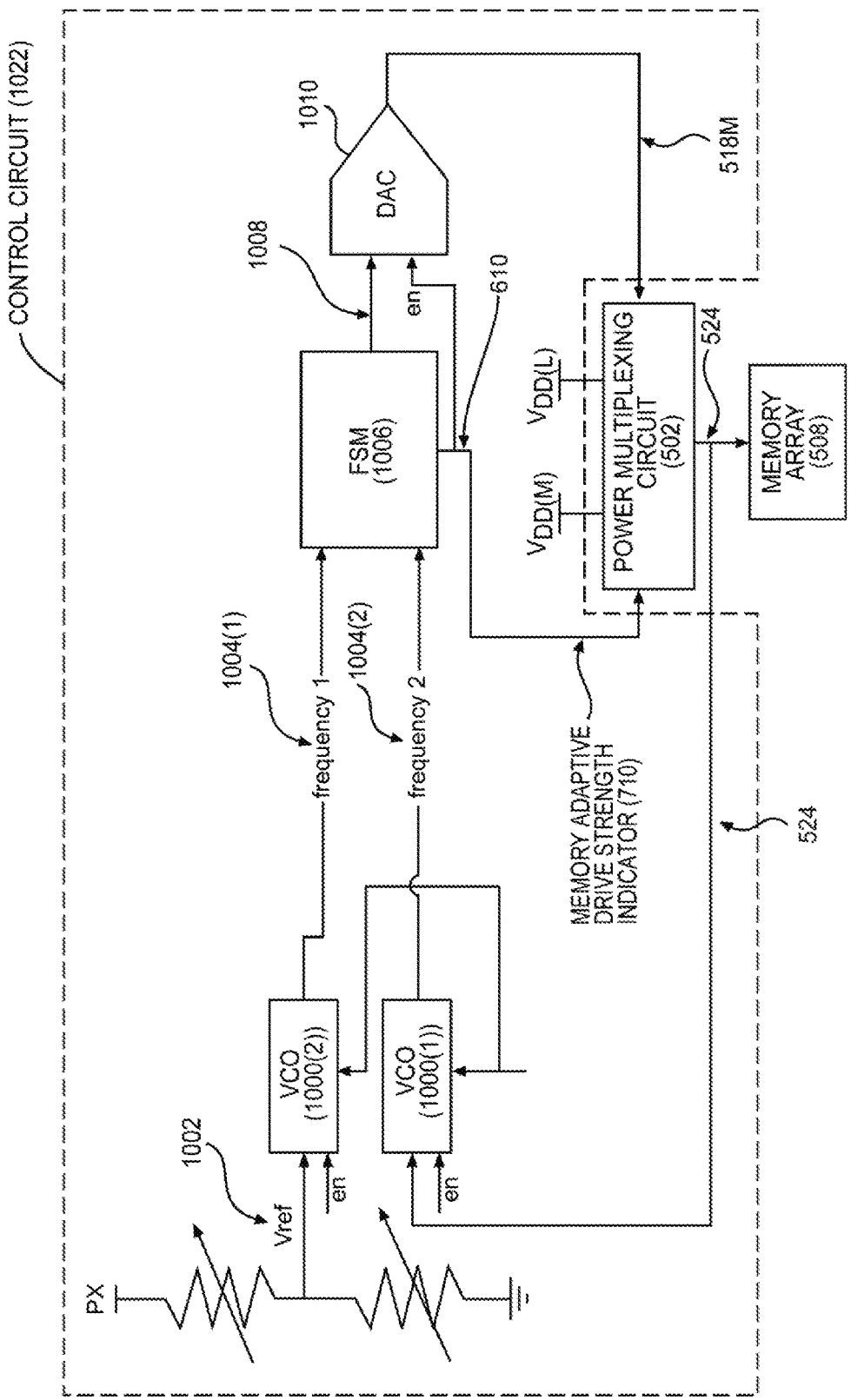
FIG. 10 is a block diagram of another exemplary control circuit that can be included in a power multiplexing system for adaptively controlling drive strength of multiplexed power from a plurality of supply power rails to an output power rail to power a powered circuit based on an output voltage at the output power rail, including but not limited to power multiplexing circuits in FIG. 2 and FIG. 5.

Other control circuits can be provided to monitor the output voltage 524 of the power multiplexing system 500 in FIG. 5 to adaptively control the drive strength of the memory voltage $V_{DD(M)}$ from the memory supply power rail 504M coupled to the output power rail 506. For example, FIG. 10 is a block diagram of an exemplary control circuit 1022 configured to adaptively control drive strength of an active memory or logic supply selection circuit 512M, 512L (FIG. 5) in the power multiplexing circuit 502 in FIG. 5 to adjust the output voltage 524 level and switch-on speed on the output power rail 506. The control circuit 1022 in FIG. 10 is shown as only controlling the memory supply selection circuit 512M in the power multiplexing circuit 502 (FIG. 5), and thus multiple control circuits 1022 would be provided to control the drive strength of each supply selection circuit 512(1)-512(N).

Figure 11:
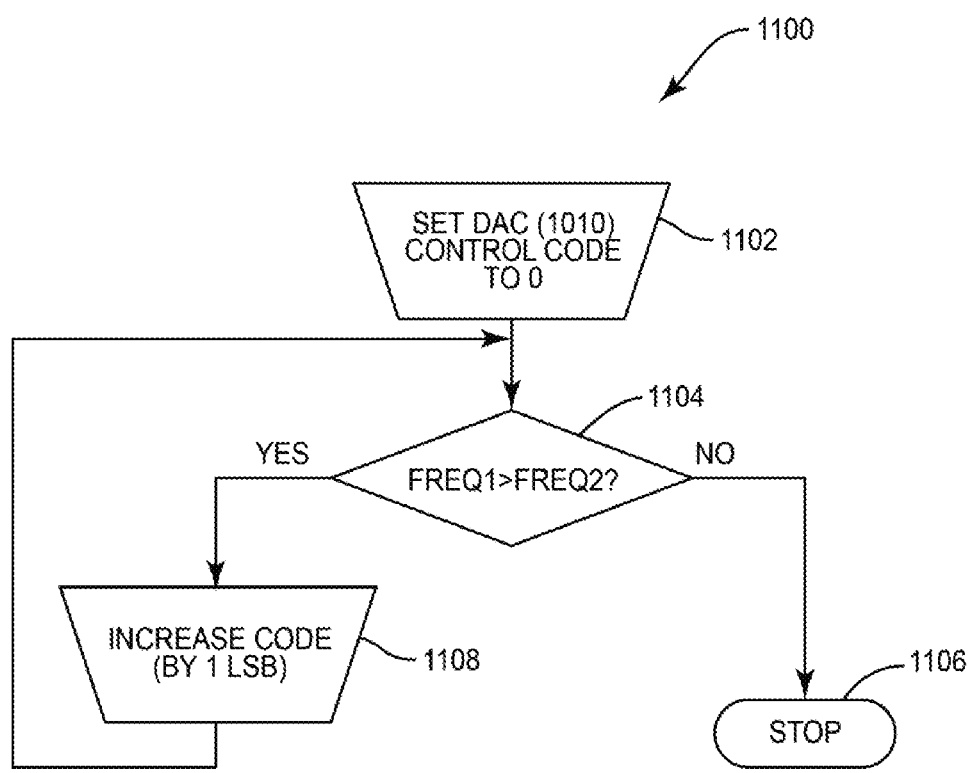
FIG. 11 is a flowchart illustrating an exemplary process of the control circuit in FIG. 10 adaptively controlling the drive strength of the active supply selection circuit in a power multiplexing circuit, including but not limited to the power multiplexing circuits in FIGS. 2 and 5.

In this regard, the output voltage 524 in FIG. 10 is coupled to a first voltage controlled oscillator (VCO) 1000(1). A predefined reference output voltage (Vref) 1002 for the memory supply selection circuit 512M (FIG. 6) is provided to a second VCO 1000(2). The VCOs 1000(1), 1000(2) generate respective frequency signals 1004(1), 1004(2) indicative of the amplitude of the output voltage 524 and the reference output voltage 1002. The frequency signals 1004(1), 1004(2) are received by a finite state machine (FSM) 1006 that compares the frequencies of the frequency signals 1004(1), 1004(2) to determine if the reference output voltage 1002 is greater than the output voltage 524. Based on this comparison, the FSM 1006 generates an output signal 1008 to a DAC 1010 to control the memory drive strength indicator 518M to control the bias of the supply selection circuit 512(1) in FIG. 5. The FSM 1006 also generates the drive strength indicator 518(1) to control the memory drive strength indicator 518M to control the drive strength of the memory supply selection circuit 512M in the power multiplexing circuit 502. As shown in exemplary process 1100 in FIG. 11 performed by the FSM 1006 in FIG. 10, the DAC 1010 may be initially set to a control code of '0' (block 1002). The FSM 1006 determines if the frequency signal 1004(1) has a higher frequency than frequency signal 1004(2) (block 1104). If not, the process 1100 stops without a change in the memory drive strength indicator 518M (block 1106). If so, the memory drive strength indicator 518M is incremented (e.g., by one (1) least significant bit (LSB)) (block 1008).

Figure 12:
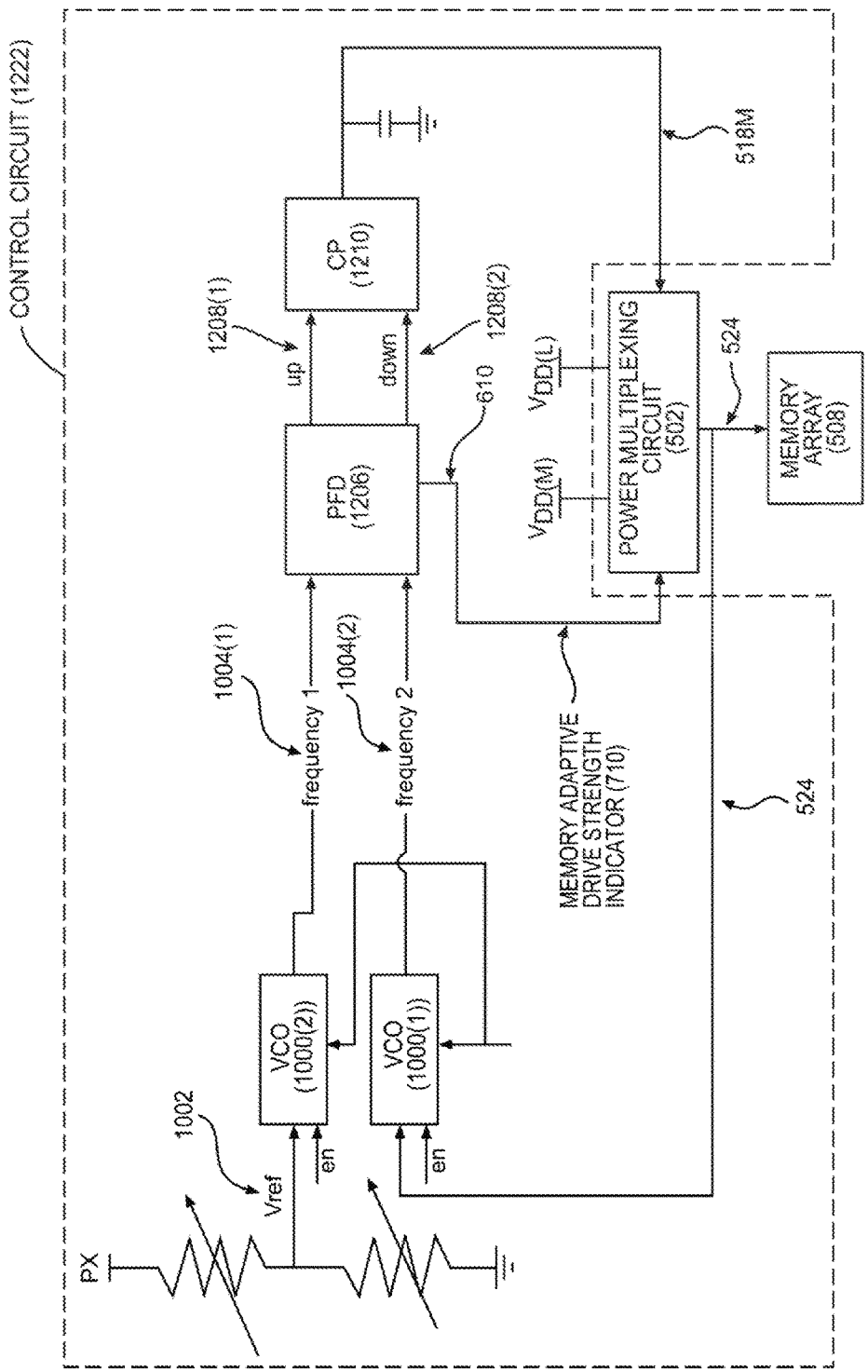
FIG. 12 is a block diagram of another exemplary control circuit that can be included in a control circuit in a power multiplexing system, including but not limited to the power multiplexing circuits in FIGS. 2 and FIG. 5, for adaptively controlling the drive strength of an active supply selection circuit in the power multiplexing circuit.

FIG. 12 is a block diagram of an exemplary control circuit 1222 configured to adaptively control drive strength of an active memory or logic supply selection circuit 512M, 512L (FIG. 5) in the power multiplexing circuit 502 in FIG. 5 to adjust the output voltage 524 level and switch-on speed on the output power rail 506. The control circuit 1222 in FIG. 12 is shown as only controlling the memory supply selection circuit 512M, and thus multiple control circuits 1222 would be provided to control the drive strength of each supply selection circuit 512(1)-512(N).

In this regard, the output voltage 524 in FIG. 12 is coupled to a first VCO 1000(1). A predefined reference output voltage (Vref) 1002 for the memory supply selection circuit 512M (FIG. 6) is provided to a second VCO 1000(2). The VCOs 1000(1), 1000(2) generate respective frequency signals 1004(1), 1004(2) indicative of the amplitude of the output voltage 524 and the reference output voltage 1002. The frequency signals 1004(1), 1004(2) are received by a phase frequency detector (PFD) 1206 that compares the frequencies of the frequency signals 1004(1), 1004(2) to determine if the reference output voltage 1002 is greater than the output voltage 524. Based on this comparison, the PFD 1206 generates output signals 1208(1), 1208(2) to a charge pump (CP) 1210 to control the memory drive strength indicator 518M to control the drive strength of the memory supply selection circuit 512M in FIG. 6.

Figure 13:
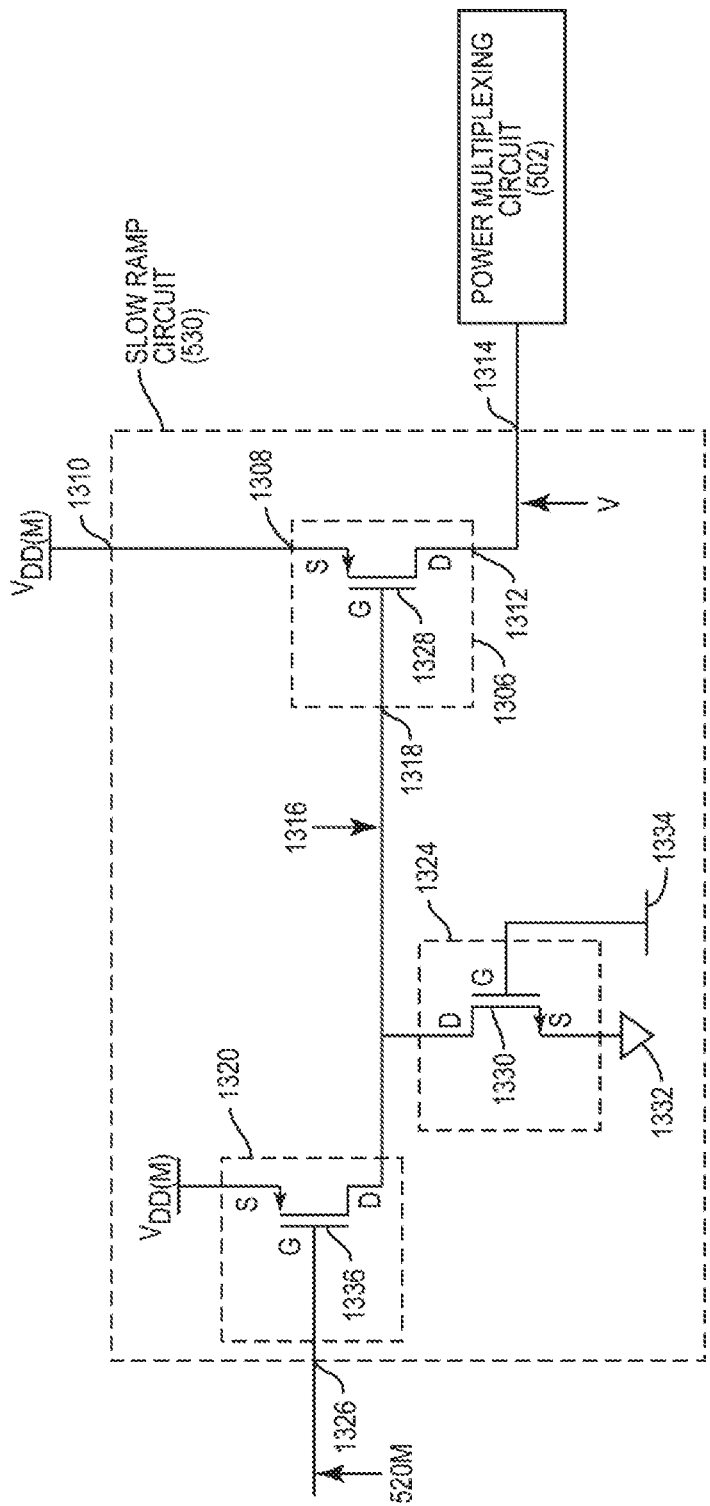
FIG. 13 is a circuit diagram of an exemplary switched power control circuit that can be provided in a control circuit for gradually providing a voltage signal to reduce or avoid in-rush current related supply noise.

FIG. 13 illustrates an example of the slow ramp circuit 530 in FIG. 5 that can be used to gradually provide the memory power switch selection signal 520M to the power multiplexing circuit 502 therein. FIG. 13 shows only ramping a single memory power switch selection signal 520 of the memory drive strength indicator 518M (FIG. 5), but it should be noted that multiple slow ramp circuits 530 like shown in FIG. 13 can be provided for each memory power switch selection signal 520M(1)-520M(T). To gradually ramp up the memory power switch selection signal 520, an output voltage V is provided, wherein the output voltage V is ramped up to the memory voltage $V_{DD(M)}$. To achieve this gradual ramping up of the output voltage V of the memory power switch selection signal 520, a head switch circuit 1306 is provided that is configured to provide the output voltage V to the power multiplexing circuit 502. The head switch circuit 1306 includes a voltage input 1308 that is coupled to a voltage input 1310 and configured to receive the memory voltage $V_{DD(M)}$. The head switch circuit 1306 also includes a voltage output 1312 that is coupled to a voltage output 1314 and configured to provide the memory power switch selection signal 520 of the output voltage V to the power multiplexing circuit 502. The head switch circuit 1306 is configured to provide the memory power switch selection signal 520 of the output voltage V to the power multiplexing circuit 502 in response to a control signal 1316 received on a control input 1318. The control signal 1316 is generated by a head switch control circuit 1320 in response to the memory power switch selection signal 520M. A current sink circuit 1324 is configured to control a ramping rate of the output voltage V of the memory power switch selection signal 520 generated by the head switch circuit 1306, thus allowing the head switch circuit 1306 to provide the full memory voltage $V_{DD(M)}$ to the power multiplexing circuit 502 in a controlled manner to reduce or avoid in-rush current related supply noise in the power multiplexing circuit 502. Controlling the ramping rate corresponds to gradually activating (i.e., gradually turning-on) the head switch circuit 1306 over time, wherein the amount of memory voltage $V_{DD(M)}$ allowed across the head switch circuit 1306 is limited by its level of activation.

With continuing reference to FIG. 13, in this aspect, the head switch circuit 1306 can be controlled by the current sink circuit 1324 when the head switch control circuit 1320 generates the control signal 1316 in response to the memory power switch selection signals 520M received on an enable input 1326. The control signal 1316 indicates that the memory voltage $V_{DD(M)}$ is to be transferred to the power multiplexing circuit 502. Components within the slow ramp circuit 530 may employ various circuit elements to achieve the functionality described above. In this aspect, the head switch circuit 1306 employs a PMOS transistor 1328 that includes a source S coupled to the voltage input 1308, a gate G coupled to the control input 1318, and a drain D coupled to the voltage output 1312. Additionally, in this aspect, the current sink circuit 1324 includes an NMOS transistor 1330 that includes a source S coupled to a ground source 1332, a drain D coupled to the gate G of the PMOS transistor 1328 of the head switch circuit 1306 (i.e., the control input 1318), and a gate G. The gate G of the NMOS transistor 1330 in this aspect is driven by a constant voltage source 1334. The head switch control circuit 1320 in this example employs a PMOS transistor 1336 that includes a source S coupled to the memory voltage $V_{DD(M)}$, a gate G configured to receive the memory power switch selection signal 520M, and a drain D coupled to the gate G of the PMOS transistor 1328 of the head switch circuit 1306 and the drain D of the NMOS transistor 1330 of the current sink circuit 1324.

Because the memory power switch selection signal 520M is coupled to the gate G of the PMOS transistor 1336 of the head switch control circuit 1320, the PMOS transistor 1336 is activated (i.e., turned-on) while the memory power switch selection signal 520M has a logic low '0' value. Further, the memory voltage $V_{DD(M)}$ is provided to the gate G of the PMOS transistor 1328 of the head switch circuit 1306 while the PMOS transistor 1336 is activated. Providing the memory voltage $V_{DD(M)}$ to the gate G of the PMOS transistor 1328 deactivates (i.e., turns-off) the PMOS transistor 1328 and prevents the memory voltage $V_{DD(M)}$ from being provided to the power multiplexing circuit 502.

In response to the memory power switch selection signal 520M transitioning to a logic high '1' value, the PMOS transistor 1336 of the head switch control circuit 1320 is deactivated, which prevents the memory voltage $V_{DD(M)}$ from being provided to the gate G of the PMOS transistor 1328 of the head switch circuit 1306. However, although the gate G of the PMOS transistor 1328 is no longer receiving the memory voltage $V_{DD(M)}$, the memory voltage $V_{DD(M)}$ remains on the gate G of the PMOS transistor 1328, as a gate capacitance associated with the gate G of the PMOS transistor 1328 is charged with the memory voltage $V_{DD(M)}$ while the memory power switch selection signal 520M has a logic low value '0'.

With continuing reference to FIG. 13, because the memory voltage $V_{DD(M)}$ provided by the head switch control circuit 1320 no longer deactivates the PMOS transistor 1328 of the head switch circuit 1306, the PMOS transistor 1328 may be activated so as to provide the output voltage V to the power multiplexing circuit 502. However, rather than fully activating the PMOS transistor 1328 in a substantially instantaneous manner, the current sink circuit 1324 is configured to gradually activate the PMOS transistor 1328 over time such that the output voltage V of the memory power switch selection signal 520 provided by the head switch circuit 1306 ramps up over time. The gate G of the NMOS transistor 1330 of the current sink circuit 1324 is driven by the constant voltage source 1334 in this example so as to activate the NMOS transistor 1330 to a level that causes the voltage on the gate G of the PMOS transistor 1328 of the head switch circuit 1306 to gradually discharge through the NMOS transistor 1330 to the ground source 1332.

With continuing reference to FIG. 13, as the voltage on the gate G of the PMOS transistor 1328 discharges, the PMOS transistor 1328 gradually activates. Notably, the level of the output voltage V of the memory power switch selection signal 520 to the power multiplexing circuit 502 by the head switch circuit 1306 corresponds to the level at which the PMOS transistor 1328 is activated. In other words, as the current sink circuit 1324 discharges the voltage on the gate G of the PMOS transistor 1328, the voltage on the gate G of the PMOS transistor 1328 crosses a threshold voltage of the PMOS transistor 1328. As the voltage on the gate G of the PMOS transistor 1328 crosses the threshold voltage, the PMOS transistor 1328 turns-on and provides a progressively higher output voltage V of the memory power switch selection signal 520 to the power multiplexing circuit 502. In this manner, the output voltage V of the memory power switch selection signal 520 provided to the power multiplexing circuit 502 gradually ramps up to the full memory voltage $V_{DD(M)}$ as the voltage on the gate G of the PMOS transistor 1328 crosses the threshold voltage.

Power multiplexing systems that are configured to adaptively control drive strength of multiplexed power from supply power rails in a power multiplexing system to a powered circuit, in accordance with the aspects in this disclosure, may also include a first supply means for selectively driving a first voltage at a first supply power rail to an output power rail at a first drive strength based on a first drive strength indicator in response to a first supply power rail selection indicator indicating a first supply power rail selection enable state. Such power multiplexing systems may also include a second supply means for selectively driving a second voltage at a second supply power rail to the output power rail at a second drive strength based on a second drive strength indicator in response to a second supply power rail selection indicator indicating a second supply power rail selection enable state. Such power multiplexing systems may also include a means for monitoring an output voltage of the output power rail. Such power multiplexing systems may also include a means for comparing a voltage level of the output voltage at the output power rail to a first reference voltage level associated with a first supply selection circuit, in response to the first supply power rail selection indicator indicating the first supply power rail selection enable state. Such power multiplexing systems may also include a means for selectively generating the first drive strength indicator based on the means for comparing the voltage level of the output voltage at the output power rail to the first reference voltage level, in response to the first supply power rail selection indicator indicating the first supply power rail selection enable state. Such power multiplexing systems may also include a means for comparing the voltage level of the output voltage at the output power rail to a second reference voltage level associated with a second supply selection circuit in response to the second supply power rail selection indicator indicating the second supply power rail selection enable state. Such power multiplexing systems may also include a means for selectively generating the second drive strength indicator based on the means for comparing the voltage level of the output voltage at the output power rail to the second reference voltage level in response to the second supply power rail selection indicator indicating the second supply power rail selection enable state.

Power multiplexing systems that are configured to adaptively control drive strength of multiplexed power from supply power rails in a power multiplexing system to a powered circuit, in accordance with the aspects in this disclosure, may be provided in or integrated into in any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 14:
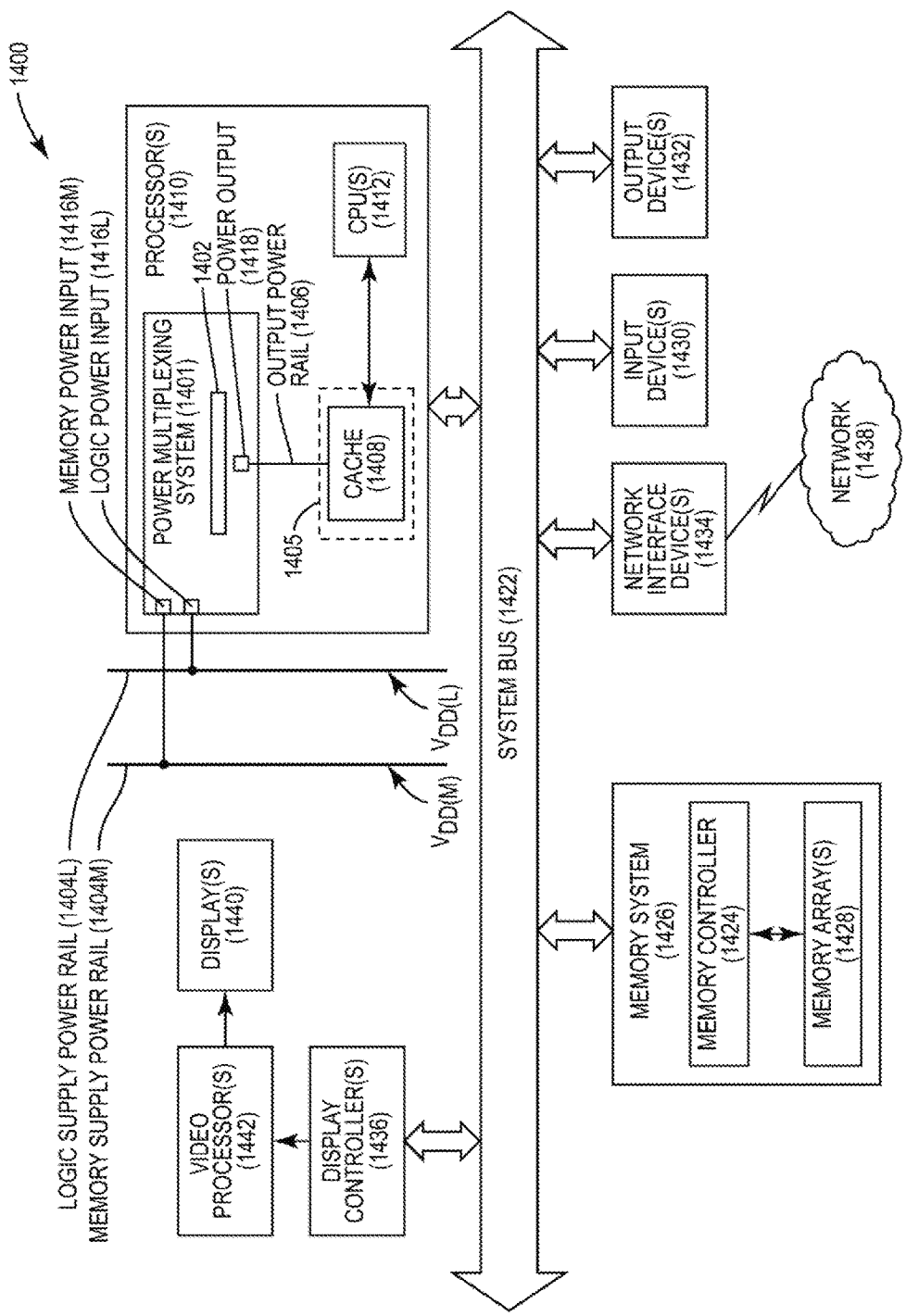
FIG. 14 is a block diagram of an exemplary processor-based system that includes a power multiplexing system that includes a control circuit configured to adaptively control drive strength of a first supply selection circuit comprising a memory supply selection circuit and a second supply selection circuit comprising a logic supply selection circuit to supply power from an associated memory supply power rail and a logic supply power rail to a memory array, based on an output voltage, and according to any of the aspects disclosed herein.

In this regard, FIG. 14 illustrates an example of a processor-based system 1400 that includes a power multiplexing system 1401 configured to control the selective coupling of one of memory and logic supply power rails 1404M, 1404L to a memory domain 1405, such as to reduce intentional decoupling capacitance in a logic domain according to any of the particular aspects discussed above. The power multiplexing system 1401 includes a power multiplexing circuit 1402 that includes adaptive drive strength control. For example, the power multiplexing circuit 1402 may be any of the power multiplexing circuits 202, 502 in FIGS. 2 and 5, respectively, as examples. In this example, the memory domain 1405 includes a cache memory 1408 that is included in a processor 1410 and coupled to one or more central processing units (CPUs) 1412 for rapid access to temporarily stored data. The power multiplexing system 1401 has a memory power input 1416M coupled to the memory supply power rail 1404M and a logic power input 1416L coupled to the logic supply power rail 1404L. The power multiplexing system 1401 has a power output 1418 coupled to an output power rail 1406 configured to provide power to the memory domain 1405. The power multiplexing system 1401 is configured to multiplex logic voltage $V_{DD(L)}$ on the logic supply power rail 1404L to the output power rail 1406 when the logic voltage $V_{DD(L)}$ is at or above the minimum operating voltage of the memory domain 1405. The power multiplexing system 1401 is configured to multiplex the memory voltage $V_{DD(M)}$ from the memory supply power rail 1404M on the output power rail 1406 when the logic voltage $V_{DD(L)}$ is below the minimum operating voltage of the memory domain 1405. Any of the features and examples described above with regard to the power multiplexing circuits 202, 502 can be provided in the power multiplexing system 1401.

In this example, the processor-based system 1400 also includes one or more processors 1410, each including one or more CPUs 1412. The processors 1410 include the cache memory 1408 coupled to the CPU(s) 1412 for rapid access to temporarily stored data. The processors 1410 are coupled to a system bus 1422 and can intercouple master and slave devices included in the processor-based system 1400. As is well known, the processors 1410 communicate with these other devices by exchanging address, control, and data information over the system bus 1422. For example, the processors 1410 can communicate bus transaction requests to a memory controller 1424 in a memory system 1426 as an example of a slave device. Although not illustrated in FIG. 14, multiple system buses 1422 could be provided, wherein each system bus 1422 constitutes a different fabric. In this example, the memory controller 1424 is configured to provide memory access requests to one or more memory arrays 1428 in the memory system 1426.

Other devices can be connected to the system bus 1422. As illustrated in FIG. 14, these devices can include one or more input devices 1430, one or more output devices 1432, one or more network interface devices 1434, and one or more display controllers 1436, as examples. The input device(s) 1430 can include any type of input device, including but not limited to input keys, switches, voice processors, etc. The output device(s) 1432 can include any type of output device, including but not limited to audio, video, other visual indicators, etc. The network interface device(s) 1434 can be any devices configured to allow exchange of data to and from a network 1438. The network 1438 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1434 can be configured to support any type of communications protocol desired.

The processors 1410 may also be configured to access the display controller(s) 1436 over the system bus 1422 to control information sent to one or more displays 1440. The display controller(s) 1436 sends information to the display(s) 1440 to be displayed via one or more video processors 1442, which process the information to be displayed into a format suitable for the display(s) 1440. The display(s) 1440 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A power multiplexing system, comprising:
a power multiplexing circuit, comprising:
   a first supply selection circuit coupled between a first supply power rail having a first voltage and an output power rail coupled to at least one powered circuit;
   a second supply selection circuit coupled between a second supply power rail having a second voltage and the output power rail;
   the first supply selection circuit configured to selectively drive the first voltage at the first supply power rail to the output power rail at a first drive strength based on a first drive strength indicator to variably adjust the output impedance of the first supply selection circuit; and
   the second supply selection circuit configured to selectively drive the second voltage at the second supply power rail to the output power rail at a second drive strength based on a second drive strength indicator to variably adjust the output impedance of the second supply selection circuit;
   wherein the first supply selection circuit further comprises a diode drop control circuit configured to establish a first diode drop connection between the first supply power rail and the output power rail, in response to a supply power rail switch signal indicating a supply power rail switch enable state to switch from supplying power to the output power rail via the first supply selection circuit to supplying power via the second supply selection circuit while the first diode drop connection is established; and at least one control circuit configured to:
  receive a first supply power rail selection indicator indicating a first supply power rail selection enable state in response to the second voltage being a voltage level less than a threshold voltage;
  receive a second supply power rail selection indicator indicating a second supply power rail selection enable state in response to the second voltage being a voltage level equal to or higher than the threshold voltage;
  monitor an output voltage of the output power rail; and
  in response to the first supply power rail selection indicator indicating the first supply power rail selection enable state:
    compare a voltage level of the output voltage at the output power rail to a first reference voltage level associated with the first supply selection circuit; and
    selectively generate the first drive strength indicator based on the comparison of the voltage level of the output voltage at the output power rail to the first reference voltage level; and
  in response to the second supply power rail selection indicator indicating the second supply power rail selection enable state:
    compare the voltage level of the output voltage at the output power rail to a second reference voltage level associated with the second supply selection circuit; and
    selectively generate the second drive strength indicator based on the comparison of the voltage level of the output voltage at the output power rail to the second reference voltage level.

2. The power multiplexing system of claim 1, wherein:
the first supply selection circuit comprises a first power switch circuit coupled between the first supply power rail and the output power rail coupled to the at least one powered circuit, the first power switch circuit configured to:
  receive the first drive strength indicator; and
  selectively drive the first voltage at the first supply power rail to the output power rail at the first drive strength based on the first drive strength indicator; and
the second supply selection circuit comprises a second power switch circuit coupled between the second supply power rail and the output power rail, the second power switch circuit configured to:
  receive the second drive strength indicator; and
  selectively drive the second voltage at the second supply power rail to the output power rail at the second drive strength based on the second drive strength indicator.

3. The power multiplexing system of claim 2, wherein:
the first power switch circuit comprises a first plurality of power head switches each having an associated drive strength and coupled between the first supply power rail and the output power rail, each of the first plurality of power head switches configured to:
  receive an associated first power switch selection signal of the first drive strength indicator; and
  selectively drive the first voltage at the first supply power rail to the output power rail in response to the received associated first power switch selection signal; and
the second power switch circuit comprises a second plurality of power head switches each having an associated drive strength and coupled between the second supply power rail and the output power rail, each of the second plurality of power head switches configured to:
  receive an associated second power switch selection signal of the second drive strength indicator; and
  selectively drive the second voltage at the second supply power rail to the output power rail in response to the received associated second power switch selection signal.

4. The power multiplexing system of claim 3, wherein:
the first plurality of power head switches comprise a first plurality of transistors each comprising a first drain, a first source, and a first gate configured to receive the associated first power switch selection signal, each configured to drive the first voltage at the first supply power rail to the output power rail in response to a voltage of the associated first power switch selection signal applied to the first gate; and
the second plurality of power head switches comprise a second plurality of transistors each comprising a second drain, a second source, and a second gate configured to receive the associated second power switch selection signal, each configured to drive the second voltage at the second supply power rail to the output power rail in response to a voltage of the associated second power switch selection signal applied to the second gate.

5. The power multiplexing system of claim 3, further comprising a slow ramp circuit configured to:
  in response to the received associated first supply power rail selection indicator indicating the first power switch selection enable state;
    receive the first drive strength indicator; and
    control a ramping rate of the first drive strength indicator; and
  in response to the received associated second supply power rail selection indicator indicating the second power switch selection enable state;
    receive the second drive strength indicator; and
    control a ramping rate of the second drive strength indicator.

6. The power multiplexing system of claim 5, wherein the slow ramp circuit comprises:
  a head switch control circuit configured to provide a drive strength indicator in response to the first power switch selection signal received on an enable input;
  a head switch circuit configured to generate a ramp control signal to control providing the drive strength indicator by the head switch control circuit in response to the first power switch selection signal; and
  a current sink circuit coupled to a slow ramp control input, the current sink circuit configured to control a ramping rate of the drive strength indicator.

7. The power multiplexing system of claim 1, wherein the diode drop control circuit is further configured to disconnect the first diode drop connection between the first supply power rail and the output power rail, in response to the supply power rail switch signal indicating a supply power rail switch disable state.

8. The power multiplexing system of claim 1, wherein, in response to the first voltage being higher than the second voltage, the diode drop control circuit is further configured to maintain a voltage of a second threshold voltage below the first voltage at the output power rail, in response to the supply power rail switch signal indicating the supply power rail switch enable state.

9. The power multiplexing system of claim 1, wherein, in response to the first voltage being lower than the second voltage, the diode drop control circuit is further configured to prevent or reduce current flow from the output power rail to the first supply power rail, in response to the supply power rail switch signal indicating the supply power rail switch enable state.

10. The power multiplexing system of claim 1, wherein, wherein the diode drop control circuit comprises:
a diode drop input coupled to a first power rail selection input of the first supply selection circuit;
a diode drop control input configured to receive the supply power rail switch signal; and
a diode drop output coupled to a first power output;
the diode drop control circuit configured to establish the first diode drop connection between the first power rail selection input and the first power output, in response to the supply power rail switch signal indicating the supply power rail switch enable state.

11. The power multiplexing system of claim 1, wherein the at least one control circuit comprises a first adaptive mode selection circuit configured to:
selectively provide the first drive strength indicator as a first bypass drive strength indicator in response to a first adaptive mode selection signal indicating an adaptive mode disable state; and
selectively provide the first drive strength indicator as a first adaptive drive strength indicator in response to the first adaptive mode selection signal indicating an adaptive mode enable state.

12. The power multiplexing system of claim 11, wherein the at least one control circuit further comprises a second adaptive mode selection circuit configured to:
selectively provide the second drive strength indicator as a second bypass drive strength indicator in response to a second adaptive mode selection signal indicating an adaptive mode disable state; and
selectively provide the second drive strength indicator as a second adaptive drive strength indicator in response to the second adaptive mode selection signal indicating an adaptive mode enable state.

13. The power multiplexing system of claim 11, wherein the first adaptive mode selection circuit comprises a first multiplexer circuit, comprising:
a first input configured to receive the first bypass drive strength indicator;
a second input configured to receive the first adaptive drive strength indicator;
a selection input configured to receive the first adaptive mode selection signal; and
an output configured to provide the first drive strength indicator;
the first multiplexer circuit configured to:
selectively provide the first bypass drive strength indicator from the first input to the output in response to the first adaptive mode selection signal from the selection input indicating the adaptive mode disable state; and
selectively provide the first adaptive drive strength indicator from the second input to the output in response to the first adaptive mode selection signal from the selection input indicating the adaptive mode enable state.

14. The power multiplexing system of claim 1, wherein the at least one control circuit comprises:

a comparator circuit configured to generate a comparison output signal indicative of a comparison in voltage level between the output voltage and a reference output voltage; and
a counter circuit configured to update a count value of a counter indicative of the voltage level based on the comparison output signal, and generate a drive strength indicator indicative of the voltage level of the output voltage;
the at least one control circuit configured to generate the first drive strength indicator comprising the drive strength indicator in response to the first supply power rail selection indicator indicating the first supply power rail selection enable state.

15. The power multiplexing system of claim 14, wherein the at least one control circuit is further configured to generate the second drive strength indicator comprising a drive strength indicator in response to the second supply power rail selection indicator indicating the second supply power rail selection enable state.

16. The power multiplexing system of claim 14, wherein the at least one control circuit further comprises a digital-to-analog converter (DAC) circuit configured to generate the reference output voltage based on a received code word.

17. The power multiplexing system of claim 14, wherein the counter circuit is further configured to update the count value of the counter in response to a received clock signal.

18. The power multiplexing system of claim 1, wherein the at least one control circuit comprises:
a first voltage controlled oscillator (VCO) configured to generate a first control voltage at a first frequency based on a reference voltage;
a second VCO configured to generate a second control voltage at a second frequency based on the output voltage at the output power rail; and
a state machine circuit configured to:
generate the first drive strength indicator based on a comparison of the first frequency of the first control voltage to the second frequency of the second control voltage in response to the first supply power rail selection indicator indicating the first supply power rail selection enable state.

19. The power multiplexing system of claim 18, wherein the state machine circuit is further configured to generate the second drive strength indicator based on a comparison of the first frequency of the first control voltage to the second frequency of the second control voltage in response to the second supply power rail selection indicator indicating the second supply power rail selection enable state.

20. The power multiplexing system of claim 18, wherein the state machine circuit comprises a phase frequency detector.

21. The power multiplexing system of claim 1, wherein:
the first supply power rail comprises a memory supply power rail configured to receive a memory voltage as the first voltage from a memory power supply in a memory domain;
the second supply power rail comprises a logic supply power rail configured to receive a logic voltage as the second voltage from a logic power supply in a logic domain; and
the at least one powered circuit comprises at least one memory array;
the at least one control circuit is configured to:
receive the first supply power rail selection indicator indicating a first supply power rail selection enable state in response to the logic voltage being a voltage level less than the threshold voltage for data retention in the at least one memory array; and
receive the second supply power rail selection indicator indicating a second supply power rail selection enable state in response to the logic voltage being a voltage level equal to or higher the threshold voltage for data retention in the at least one memory array;
the first supply selection circuit is configured to selectively drive the memory voltage at the memory supply power rail to the output power rail at the first drive strength based on the first drive strength indicator; and
the second supply selection circuit is configured to selectively drive the logic voltage to the output power rail at the second drive strength based on the second drive strength indicator.

22. The power multiplexing system of claim 1 integrated into a system-on-a-chip (SoC).

23. The power multiplexing system of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

24. A power multiplexing system, comprising:
a first supply means for selectively driving a first voltage at a first supply power rail to an output power rail at a first drive strength based on a first drive strength indicator;
a second supply means for selectively driving a second voltage at a second supply power rail to the output power rail at a second drive strength based on a second drive strength indicator;
a means for establishing a first diode drop connection between the first supply power rail and the output power rail, in response to a supply power rail switch signal indicating a supply power rail switch enable state to switch from supplying power to the output power rail via the first supply means to supplying power via the second supply means while the first diode drop connection is established;
a means for receiving a first supply power rail selection indicator indicating a first supply power rail selection enable state in response to the second voltage being a voltage level less than a threshold voltage;
a means for receiving a second supply power rail selection indicator indicating a second supply power rail selection enable state in response to the second voltage being a voltage level equal to or higher than the threshold voltage;
a means for monitoring an output voltage of the output power rail;
a means for comparing a voltage level of the output voltage at the output power rail to a first reference voltage level associated with a first supply selection circuit, in response to the first supply power rail selection indicator indicating the first supply power rail selection enable state;
a means for selectively generating the first drive strength indicator based on the means for comparing the voltage level of the output voltage at the output power rail to the first reference voltage level, in response to the first supply power rail selection indicator indicating the first supply power rail selection enable state;
a means for comparing the voltage level of the output voltage at the output power rail to a second reference voltage level associated with a second supply selection circuit in response to the second supply power rail selection indicator indicating the second supply power rail selection enable state; and
a means for selectively generating the second drive strength indicator based on the means for comparing the voltage level of the output voltage at the output power rail to the second reference voltage level in response to the second supply power rail selection indicator indicating the second supply power rail selection enable state.

25. A method of adaptively controlling drive strength of multiplexed power from supply power rails in a power multiplexing circuit to a powered circuit, comprising:
monitoring an output voltage of an output power rail;
in response to a first supply power rail selection indicator indicating a first supply power rail selection enable state:
comparing a voltage level of the output voltage at the output power rail to a first reference voltage level associated with a first supply selection circuit;
selectively generating a first drive strength indicator based on the comparison of the voltage level of the output voltage at the output power rail to the first reference voltage level; and
selectively driving a first voltage at a first supply power rail to the output power rail via a first supply selection circuit at a first drive strength based on the first drive strength indicator variably adjusting the output impedance of the first supply selection circuit;
in response to a second supply power rail selection indicator indicating a second supply power rail selection enable state:
comparing the voltage level of the output voltage at the output power rail to a second reference voltage level associated with a second supply selection circuit;
selectively generating a second drive strength indicator based on the comparison of the voltage level of the output voltage at the output power rail to the second reference voltage level; and
selectively driving a second voltage at a second supply power rail to the output power rail via a second supply selection circuit at a second drive strength based on the second drive strength indicator variably adjusting the output impedance of the second supply selection circuit;
generating the first supply power rail selection indicator indicating the first supply power rail selection enable state in response to the second voltage being a voltage level less than a threshold voltage;
generating the second supply power rail selection indicator indicating the second supply power rail selection enable state in response to the second voltage being a voltage level equal to or higher than the threshold voltage; and
establishing a diode drop connection between the first supply power rail and the output power rail, in response to a supply power rail switch signal indicating a supply power rail switch enable state to switch from supplying power to the output power rail via the first supply selection circuit to supplying power via the second supply selecting circuit while the first diode drop connection is established.

26. The method of claim 25, wherein:
selectively driving the first voltage at the first supply power rail comprises selectively driving one or more power head switches of a first plurality of power head switches each having an associated drive strength and coupled between the first supply power rail and the output power rail, based on the first drive strength indicator; and
selectively driving the second voltage at the second supply power rail comprises selectively driving one or more power head switches of a second plurality of power head switches each having an associated drive strength and coupled between the second supply power rail and the output power rail, based on the second drive strength indicator.

27. The method of claim 26, further comprising:
generating a ramp control signal to control providing a drive strength indicator in response to a first power switch selection signal; and
controlling a ramping rate of the drive strength indicator.

28. The method of claim 25, further comprising disconnecting the diode drop connection between the first supply power rail and the output power rail, in response to the supply power rail switch signal indicating a supply power rail switch disable state.

29. The method of claim 25, further comprising maintaining a voltage of a second threshold voltage below the first voltage at the output power rail for the diode drop connection, in response to the supply power rail switch signal indicating the supply power rail switch enable state, and in response to the first voltage being higher than the second voltage.

30. The method of claim 25, further comprising preventing or reducing current flow from the output power rail to the first supply power rail, in response to the supply power rail switch signal indicating the supply power rail switch enable state, and in response to the first voltage being lower than the second voltage.

31. The method of claim 25, further comprising:
selectively providing the first drive strength indicator as a first bypass drive strength indicator in response to a first adaptive mode selection signal indicating an adaptive mode disable state; and
selectively providing the first drive strength indicator as a first adaptive drive strength indicator in response to the first adaptive mode selection signal indicating an adaptive mode enable state.

32. The method of claim 31, further comprising:
selectively providing the second drive strength indicator as a second bypass drive strength indicator in response to a second adaptive mode selection signal indicating an adaptive mode disable state; and selectively providing the second drive strength indicator as a second adaptive drive strength indicator in response to the second adaptive mode selection signal indicating an adaptive mode enable state.

33. The method of claim 25, wherein selectively generating the first drive strength indicator based on the comparison of the voltage level of the output voltage at the output power rail to the first reference voltage level, comprises:
generating a comparison output signal indicative of a comparison in voltage level between the output voltage and a reference output voltage;
updating a count value of a counter indicative of the voltage level based on the comparison output signal;
generating a drive strength indicator indicative of the voltage level of the output voltage; and
generating the first drive strength indicator comprising the drive strength indicator in response to the first supply power rail selection indicator indicating the first supply power rail selection enable state.

34. The method of claim 25, wherein selectively generating the second drive strength indicator based on the comparison of the voltage level of the output voltage at the output power rail to the second reference voltage level, comprises:
generating a comparison output signal indicative of the comparison in voltage level between the output voltage and a reference output voltage; and
updating a count value of a counter indicative of the voltage level based on the comparison output signal;
generating a second power rail drive strength indicator indicative of the voltage level of the output voltage; and
generating the second drive strength indicator comprising the drive strength indicator in response to the second supply power rail selection indicator indicating the second supply power rail selection enable state.

35. The method of claim 25, wherein selectively generating the first drive strength indicator based on the comparison of the voltage level of the output voltage at the output power rail to the first reference voltage level comprises:
generating a first control voltage at a first frequency based on a reference voltage;
generating a second control voltage at a second frequency based on the output voltage at the output power rail; and
generating the first drive strength indicator based on a comparison of the first frequency of the first control voltage to the second frequency of the second control voltage in response to the first supply power rail selection indicator indicating the first supply power rail selection enable state.

36. The method of claim 35, further comprising generating the second drive strength indicator based on the comparison of the first frequency of the first control voltage to the second frequency of the second control voltage in response to the second supply power rail selection indicator indicating the second supply power rail selection enable state.

* * * * *